(12) United States Patent
Zang et al.

(10) Patent No.: US 11,335,718 B2
(45) Date of Patent: May 17, 2022

(54) CELL DEEP TRENCH ISOLATION STRUCTURE FOR NEAR INFRARED IMPROVEMENT

(71) Applicant: OMNIVISION TECHNOLOGIES, INC., Santa Clara, CA (US)

(72) Inventors: Hui Zang, San Jose, CA (US); Cunyu Yang, Los Gatos, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 183 days.

(21) Appl. No.: 16/931,229

(22) Filed: Jul. 16, 2020

(65) Prior Publication Data

US 2022/0020790 A1  Jan. 20, 2022

(51) Int. Cl.
  *H01L 27/146*  (2006.01)
  *H04N 5/33*  (2006.01)

(52) U.S. Cl.
  CPC ...... *H01L 27/1463* (2013.01); *H01L 27/1462* (2013.01); *H01L 27/1464* (2013.01); *H01L 27/14603* (2013.01); *H01L 27/14621* (2013.01); *H01L 27/14627* (2013.01); *H01L 27/14645* (2013.01); *H01L 27/14649* (2013.01); *H04N 5/332* (2013.01)

(58) Field of Classification Search
  CPC .......... H01L 27/1463; H01L 27/14643; H01L 27/14645; H01L 27/14649; H01L 27/1464; H01L 27/14603; H01L 27/14625
  See application file for complete search history.

(56) References Cited

U.S. PATENT DOCUMENTS

| | | | |
|---|---|---|---|
| 7,799,487 B2 * | 9/2010 | Hamouda | G03F 1/36 716/55 |
| 9,991,309 B1 * | 6/2018 | Yang | H01L 27/1463 |
| 10,373,997 B2 | 8/2019 | Choi et al. | |
| 2016/0056200 A1 * | 2/2016 | Lee | H01L 27/14603 257/292 |
| 2016/0225922 A1 * | 8/2016 | Akkaya | H01L 27/14685 |
| 2020/0365636 A1 * | 11/2020 | Chen | H01L 27/14621 |

FOREIGN PATENT DOCUMENTS

| | | | | |
|---|---|---|---|---|
| CN | 110634899 A | * | 12/2019 | ......... H01L 27/1463 |
| WO | WO-2020170841 A1 | * | 8/2020 | ............. G01S 17/08 |

* cited by examiner

*Primary Examiner* — Scott B Geyer
(74) *Attorney, Agent, or Firm* — Perkins Coie LLP

(57) ABSTRACT

A pixel cell includes a photodiode disposed in a pixel cell region and proximate to a front side of a semiconductor layer to generate image charge in response to incident light directed through a backside to the photodiode. A cell deep trench isolation (CDTI) structure is disposed in the pixel cell region along an optical path of the incident light to the photodiode and proximate to the backside. The CDTI structure includes a central portion extending a first depth from the backside towards the front side. Planar outer portions extend laterally outward from the central portion. The planar output portions further extend a second depth from the backside towards the front side. The first depth is greater than the second depth. Planes formed by each of the planar outer portions intersect in a line coincident with a longitudinal center line of the central portion of the CDTI structure.

44 Claims, 16 Drawing Sheets

CELL DEEP TRENCH ISOLATION STRUCTURE FOR NEAR INFRARED IMPROVEMENT

BACKGROUND INFORMATION

Field of the Disclosure

This disclosure relates generally to image sensors, and in particular but not exclusively, relates to complementary metal oxide semiconductor (CMOS) image sensors with near infrared light sensitivity.

Background

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene.

Two fields of applications in which image quality and light sensitivity are particularly important are security and automotive applications. For these applications the image sensor chip must typically provide high quality images in the visible light spectrum as well as have improved sensitivity in the infrared (IR) and/or near infrared (NIR) portions of the light spectrum. For instance, IR or NIR sensors may be used to provide improved visibility and imaging in low light and foggy conditions as well as help detect warmer objects in cooler environments.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
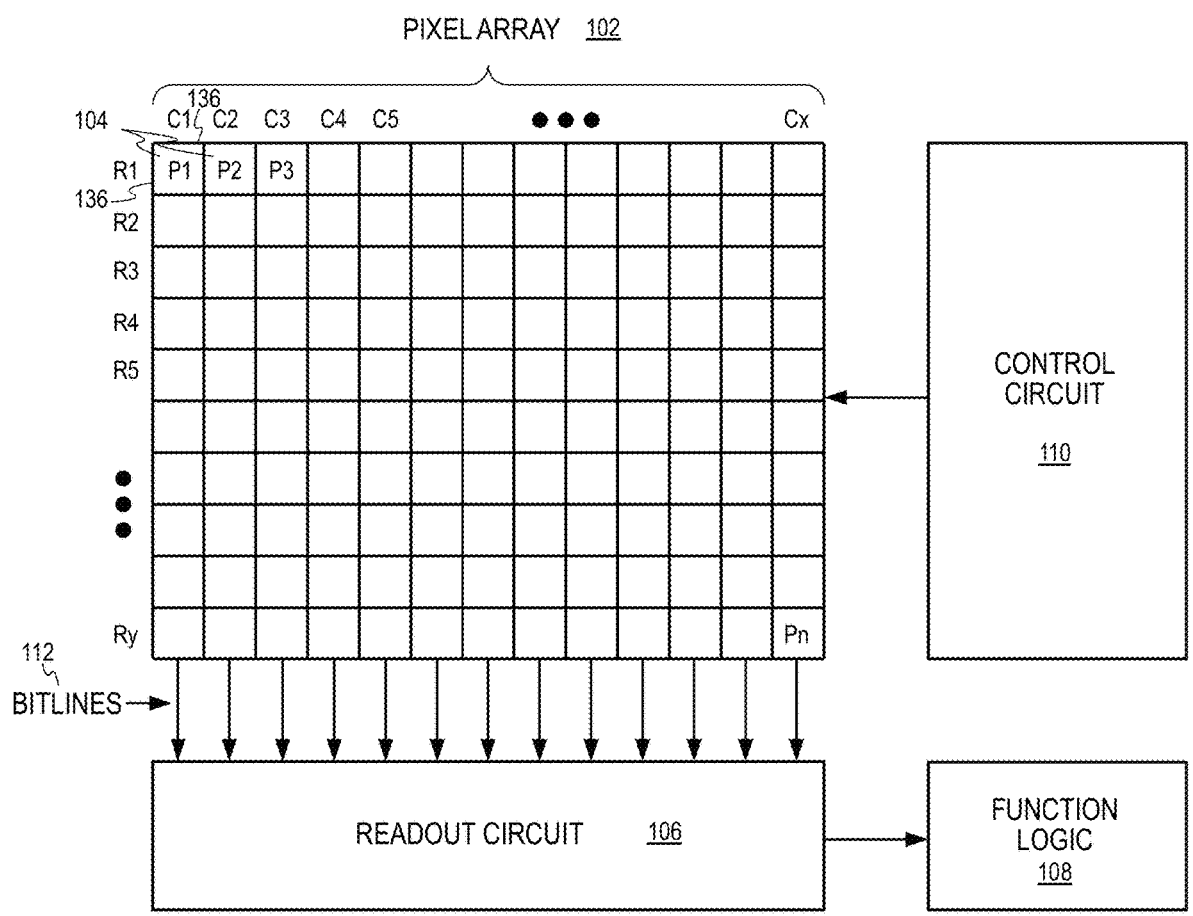
FIG. 1 illustrates one example of an imaging system including an array of pixel cells with cell deep trench isolation structures that help provide improved near infrared light sensitivity in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system with pixel cells including cell deep trench isolation structures that improve near infrared light sensitivity are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with an array of pixel cells including cell deep trench isolation (CDTI) structures are disclosed, which improve quantum efficiency (QE) performance, near infrared (NIR) light sensitivity, as well as reduce crosstalk. In various examples, the CDTI structures may be included in pixel cells adapted to detect NIR light, IR light, and/or the visible light spectrum as well as one or more of the neighboring pixel cells that are adapted to detect other colors of light such as red light, green light, blue light, etc. As will be shown, in the various examples the pixel cells include a photodiode disposed in a pixel cell region of a semiconductor layer and proximate to a front side of the semiconductor layer to generate image charge in response to incident light that is directed through a backside of the semiconductor layer to the photodiode. A CDTI structure is disposed in the pixel cell region of the semiconductor layer along an optical path of the incident light to the photodiode and proximate to a backside of the semiconductor layer. The CDTI structure includes a central portion extending a first depth from the backside towards the front side of the semiconductor layer. The CDTI structure also includes a plurality of planar outer portions extending laterally outward from the central portion in the semiconductor layer. The plurality of planar output portions extend a second depth from the backside towards the front side of the semiconductor layer. The first depth is greater than the second depth and planes that are formed by the plurality of planar outer portions intersect in a line coincident with a longitudinal center line of the central portion of the CDTI structure.

To illustrate, FIG. 1 illustrates one example of a complementary metal oxide semiconductor (CMOS) imaging system 100 with an image sensor including a pixel array with an array of pixel cells that include cell deep trench isolation (CDTI) structures that improve quantum efficiency (QE) performance, near infrared (NIR) light sensitivity, as well as reduce crosstalk in accordance with the teachings of the present invention. As shown in the depicted example, the imaging system 100 includes an image sensor with pixel array 102, a control circuit 110, a readout circuit 106, and function logic 108. In one example, pixel array 102 is a two-dimensional (2D) array of pixel cells 104 that include photodiodes. In one example, the pixel cells 104 (e.g., P1, P2, . . . , Pn) are arranged into rows (e.g., R1 to Ry) and columns (e.g., C1 to Cx) to acquire image data of a person, place, object, etc., which can then be used to render an image of a person, place, object, etc. In one example, the pixel cells 104 are separated from each other with a deep trench isolation (DTI) structure 136 formed into a grid structure, which includes portions that are disposed between neighboring pixel cells 104 to provide isolation.

As will be described in greater detail below, various examples of the pixel array 102 include pixel cells 104 that are adapted to detect various colors of visible light as well as infrared (IR) and/or near infrared (NIR) light. In the various examples, CDTI structures are included in the pixel cells 104 that are adapted to detect NIR light. In some of the examples, the CDTI structures may also be included in at least some of the neighboring pixel cells 104 that are adapted to detect other colors of light (e.g., red light, green light, blue light, etc.). In some examples, the CDTI structures that are included in at least some of the neighboring pixel cells 104 may have the same shape as the CDTI structures that are included in the pixel cells 104 that are adapted to detect NIR. In some examples, the CDTI structures that are included in at least some of the neighboring pixel cells 104 may have a different shape than the CDTI structures that are included in the pixel cells 104 that are adapted to detect NIR. In some examples, CDTI structures are not included in neighboring pixel cells 104 that are adapted to detect other colors of light (e.g., red light, green light, blue light, etc.).

After the photodiodes of pixel cells 104 have acquired their image charge, the corresponding analog image signals are read out by readout circuit 106 through column bitlines 112. In the various examples, readout circuit 106 includes an analog-to-digital conversion (ADC) circuit 114, which is coupled to convert the analog image signals received from the pixel cells 104 through bitlines 112 to digital image signals, which may be then transferred to function logic 108. Function logic 108 may simply store the image data or even manipulate the image data by applying post image processing or effects. Such image processing may, for example, include image processing, image filtering, image extraction and manipulation, determination of light intensity, crop, rotate, remove red eye, adjust brightness, adjust contrast, etc.

In one example, a control circuit 110 is coupled to pixel array 102 to control operational characteristics of pixel array 102. For instance, in one example, control circuit 110 generates the transfer gate signals and other control signals to control the transfer and readout of image data from all of the pixel cells 104 of pixel array 102. In addition, control circuit 110 may generate a shutter signal for controlling image acquisition. In one example, the shutter signal is a rolling shutter signal such that each row of the pixel array 102 is read out sequentially row by row during consecutive acquisition windows. The shutter signal may also establish an exposure time, which is the length of time that the shutter remains open. In one embodiment, the exposure time is set to be the same for each of the frames.

Figure 2A:
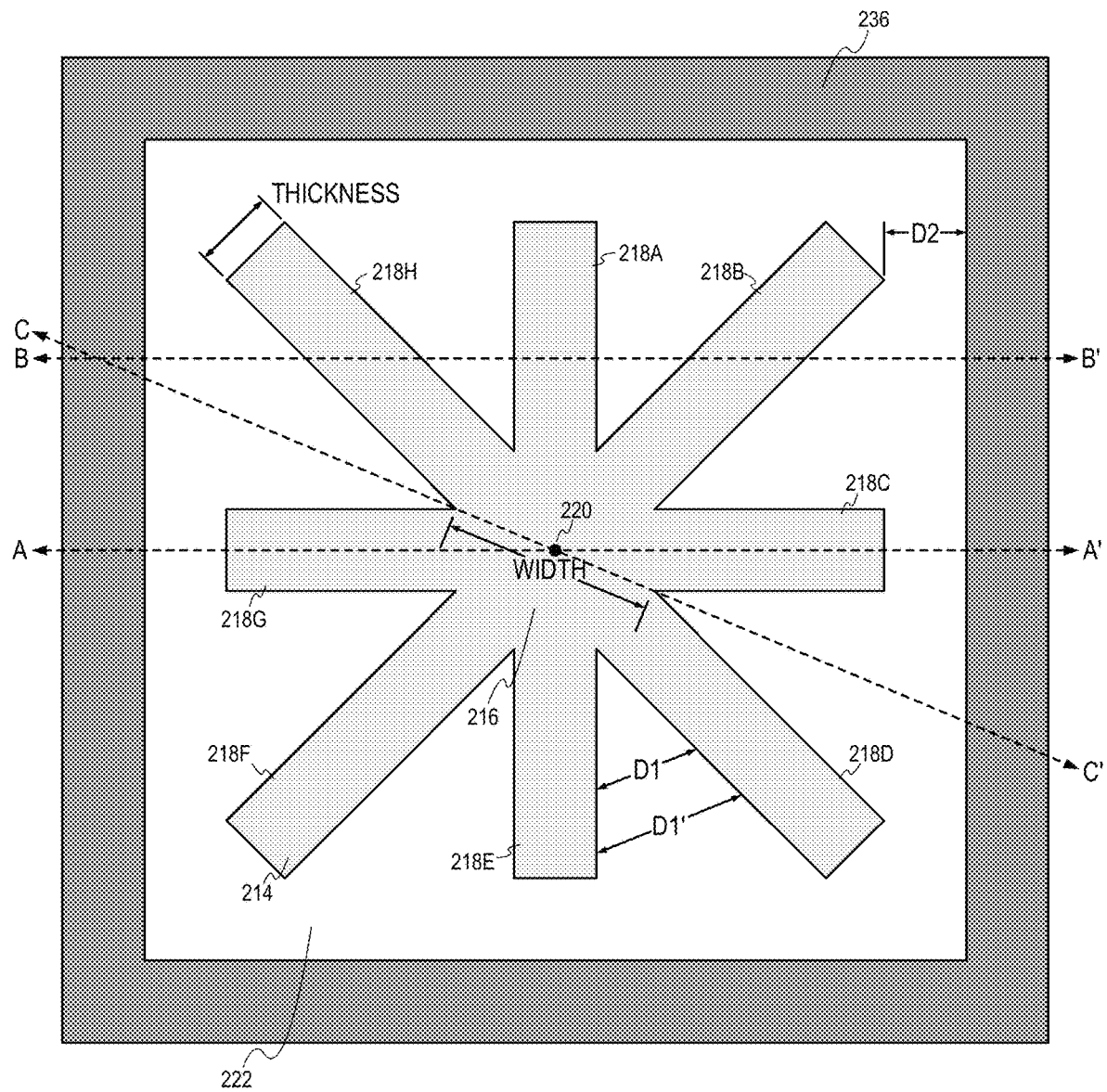
FIG. 2A is an example top view a pixel cell illustrating one example of a cell deep trench isolation structure in accordance with the teachings of the present invention.

FIG. 2A is an example top view a pixel cell 204 illustrating one example of a CDTI structure 214 in accordance with the teachings of the present invention. It is noted that example pixel cell 204 of FIG. 2A may be an example of one or more of the pixel cells 104 of the example pixel array 102 of FIG. 1, and it should be appreciated that similarly named and numbered elements referenced below are coupled and function as described above. As shown in the depicted example, pixel cell 204 is adapted to detect incident light including NIR light or IR light. In the example, pixel cell 204 includes a CDTI structure 214 disposed in a pixel cell 204 region of the semiconductor layer 222. In one example, CDTI structure 214 is formed with a low k material, an oxide material, or other suitable dielectric material in the semiconductor layer 222. In one example, the semiconductor layer 222 may include silicon or another suitable type of semiconductor material. As will be more apparent in another view below, example CDTI structure 214 is disposed proximate to a backside of the semiconductor layer 222 and along an optical path of incident light that is directed to a photodiode proximate to a front side the semiconductor layer 222 along the optical path.

As shown in the top view of example of pixel cell 204 in FIG. 2A, CDTI structure 214 includes a central portion 216 and a plurality of planar outer portions 218A, 218B, 218C, 218D, 218E, 218F, 218G, 218H that extend laterally outward from the central portion 216 in the semiconductor layer 222. Planes that are formed with the plurality of planar outer portions 218A, 218B, 218C, 218D, 218E, 218F, 218G, 218H intersect in a line that is coincident or overlaps with a longitudinal center line 220 of the central portion 216 of the CDTI structure 214. It is noted that the longitudinal center line 220 is a line that extends into or out from the page, and is therefore illustrated as a point in FIG. 2A.

As shown in the example illustrated in FIG. 2A, it is noted that the plurality of planar outer portions includes at least eight planar outer portions 218A, 218B, 218C, 218D, 218E, 218F, 218G, 218H. It is also noted that the plurality of planar outer portions includes pairs of planar outer portions that are coplanar. For instance, in the example depicted in FIG. 2A, there are four pairs of planar outer portions shown, which form coplanar outer portion pairs 218A/218E, 218B/218F, 218C/218G, 218D/218H. As such, it is appreciated that the top view of CDTI structure 214 may resemble a "cog" or "gear" shaped structure or overlapping "+" and "x" shapes in the semiconductor layer 222. In the example, the distance between neighboring planar outer portions 218 is a first distance D1, which increases as shown with first distance D1' being increasingly greater than D1 as the distance from the central portion 216 increases.

As shown in the depicted example, the width of the central portion 216 is greater than the thickness of each of the plurality of planar outer portions 218 of the CDTI structure 214. Therefore, in one example and as will be shown in greater detail below, it is noted that a first depth of the trench that is etched to form central portion 216 in semiconductor layer 222 is deeper than a second depth of the trenches that are etched to form the plurality of planar outer portions 218 as a result of the etch loading effect when etching the respective trenches to form CDTI structure 214 in accordance with the teachings of the present invention. In other words, the depth of the central portion 216 is generally greater than the depth of the plurality of planar outer portions 218 in the semiconductor layer 222 due to the etch loading effect.

It is noted that although example CDTI structure 214 is illustrated in FIG. 2A with eight planar outer portions 218A, 218B, 218C, 218D, 218E, 218F, 218G, 218H or four coplanar outer portion pairs 218A/218E, 218B/218F, 218C/218G, 218D/218H, in other examples, CDTI structure 214 may include a different number of planar outer portions 218. Further, it is appreciated that although an even number of planar portions 218 are illustrated in example CDTI structure 214 of FIG. 2A, in other examples, an odd number of planar outer portions 218 may be included. The number of planar outer portions 218 and the angle between neighboring planar outer portions 218 may be designed based on optimal QE performance and processing capability. In various examples, it is noted that some example values for the thickness of each of the plurality of planar outer portions 218 may include 0.15 µm, 0.23 µm, or 0.3 µm for example pixel cell sizes in the range of 0.7 to 4 µm. The width of the central portion 216 can vary accordingly based on the number of planar outer portions 218 that are included in CDTI structure 214. For instance, as the number of planar outer portions 218 increases in a CDTI structure 214, the width of the central portion 216 increases accordingly. As such, the depth of the central portion 216 increases accordingly compared to the thickness of the planar outer portions 218 due to the etch loading effect when etching the respective trenches to form CDTI structure 214.

In the example illustrated in FIG. 2A, it is noted that pixel cell 204 also includes a deep trench isolation structure, which is also referred to as a backside deep trench isolation (BDTI) structure 236 that surrounds the pixel cell 204 region of the semiconductor layer 222. In the example, the BDTI structure 236 therefore isolates or separates the pixel cell 204 from neighboring pixel cells in the pixel array. For instance, referring back to the example illustrated in FIG. 1, the BDTI structure 236 surrounding each of the pixel cells 204 as shown in FIG. 2A forms collectively a grid structure 136 that provides a boundary between each of the pixel cells 104 in the pixel array 102 in FIG. 1.

As will be shown in greater detail below, in one example, the BDTI structure 236 extends a third depth from the backside towards the front side of the semiconductor layer 222 to isolate or separate each of the pixel cells 204 from neighboring pixel cells. In one example, the BDTI structure 236 extends the third depth from the backside into the semiconductor layer 222 toward the front side of the semiconductor layer 222 to form a partial backside deep trench isolation structure such that the third depth is greater than the first depth of CDTI structure 214 and less than the thickness of the semiconductor layer 222 between the backside and the front side. In another embodiment, the third depth is substantially equal to the thickness of the semiconductor layer 222 such that the BDTI structure 236 extends between the backside and the front side of the semiconductor layer 222. The BDTI structure 236 may be formed of a low k material, an oxide material, or other suitable dielectric material in the semiconductor layer 222. The BDTI structure 236 may be formed with the same or different material as the CDTI structure 214.

FIG. 2A shows that in one example, an outer end of each of the plurality of planar outer portions 218 is spaced apart and separated from the BDTI structure 236 by an approximately equal second distance D2. In one example, the second distance D2 is in an approximate range of 200 to 300 nm. In other examples, it is appreciated that each of the plurality of planar outer portions 218 may extend from the central portion 216 all the way to the BDTI structure 236 such that the second distance D2 is equal to zero and the plurality of planar outer portions 218 of CDTI structure 214 are interconnected with the BDTI structure 236.

Figure 2B:
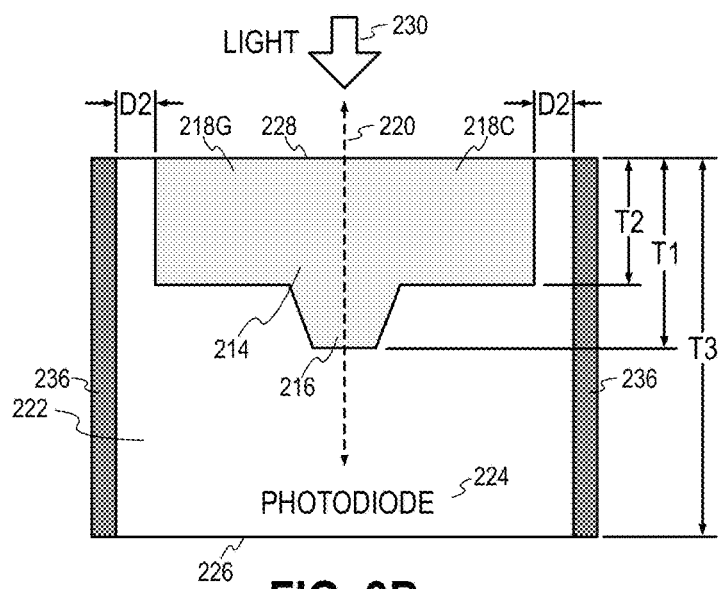
FIG. 2B is an example cross-section view of a pixel cell through a central portion and a coplanar pair of outer portions of the example cell deep trench isolation structure of FIG. 2A in accordance with the teachings of the present invention.

FIG. 2B is an example cross-section view of a pixel cell 204 through the central portion and a coplanar pair of outer portions of the example CDTI structure 214 of FIG. 2A in accordance with the teachings of the present invention. In other words, it is appreciated that example pixel cell 204 of FIG. 2B may be another view of example pixel cell 204 of FIG. 2A, and that similarly named and numbered elements referenced below are coupled and function as described above. It is noted that the example cross-section view of pixel cell 204 shown in FIG. 2B may correspond to a cross-section view of pixel cell 204 of FIG. 2A along dashed line A-A'.

As shown in the example depicted in FIG. 2B, pixel cell 204 includes a photodiode 224 disposed in a pixel cell region of a semiconductor layer 222 and proximate to a front side 226 of the semiconductor layer 222 to generate image charge in response to incident light 230 that is directed through a backside 228 of the semiconductor layer 222 to the photodiode 224. The CDTI structure 214 is disposed in the pixel cell 204 region of the semiconductor layer 222 along an optical path of the incident light 230 to the photodiode 224 and proximate to a backside 228 of the semiconductor layer 222. As shown in the illustrated example, the CDTI structure 214 includes a central portion 216, which extends a first depth T1 from the backside 228 towards the front side 226 of the semiconductor layer 222. The CDTI structure 214 also includes a plurality of planar outer portions, of which planar outer portions 218C, 218G are visible in FIG. 2B, and which extend laterally outward from the central portion 216 in the semiconductor layer 222. As shown in the illustrated example, planar outer portions 218C, 218G extend a second depth T2 from the backside 228 towards the front side 226 of the semiconductor layer 222. As mentioned above, in the various examples, the width of the central portion 216 is greater than the thickness of the planar outer portions 218C, 218G and as such, the first depth T1 of central portion 216 is greater than the second depth T2 of the plurality of planar outer portions 218C, 218G due to the etch loading effect when etching the trenches to form CDTI structure 214.

The example depicted in FIG. 2B also illustrates an example in which the depths of the planar outer portions 218C, 218G closer to the inner ends or the ends that are closer to the central portion 216 may be deeper compared to the second depth T2 of at outer edges of the plurality of planar outer portions 218C, 218G. For instance, in one example, the depths of the planar outer portions 218C, 218G may vary from substantially the same depth as the first depth T1 towards the inner ends or the ends that are closest to the central portion 216 to the second depth T2 towards the outer edges of the plurality of planar outer portions 218C, 218G. In one embodiment, the difference between the first depth T1 of central portion 216 and the second depth T2 of the plurality of planar outer portions 218C, 218G may be in a range between 5 nm to 200 nm.

As described above in FIG. 2A, it is appreciated that CDTI structure 214 of FIG. 2B includes additional planar outer portions, which are outside of the plane and therefore not visible in the cross-section view depicted in FIG. 2B. Planes that are formed by the plurality of planar outer portions 218 of CDTI structure 214 intersect in a line that is coincident or overlaps with the longitudinal center line 220 of the central portion 216 of the CDTI structure 214 as shown in FIG. 2B.

The example cross-section view illustrated in FIG. 2B also shows that pixel cell 204 includes a BDTI structure 236 that surrounds the pixel cell 204 region of the semiconductor layer 222. As illustrated in the depicted example, the BDTI structure 236 extends a third depth T3 from the backside 228 towards the front side 226 of the semiconductor layer 222 to isolate or separate each of the pixel cells 204 from neighboring pixel cells in the pixel array. In depicted example, the third depth T3 is greater than the first depth T1 and substantially equal to the thickness of the semiconductor layer 222 such that BDTI structure 236 extends from the backside 228 to the front side 226 of the semiconductor layer 222. FIG. 2B shows that in one example, the outer end of each of the plurality of planar outer portions 218 is spaced apart and separated from the BDTI structure 236 by an approximately equal second distance D2. In other examples, it is appreciated that each of the plurality of planar outer portions 218 may extend laterally from the central portion 216 all the way to the BDTI structure 236 such that the second distance D2 is equal to zero and the plurality of planar outer portions 218 are interconnected with the BDTI structure 236.

Figure 2C:
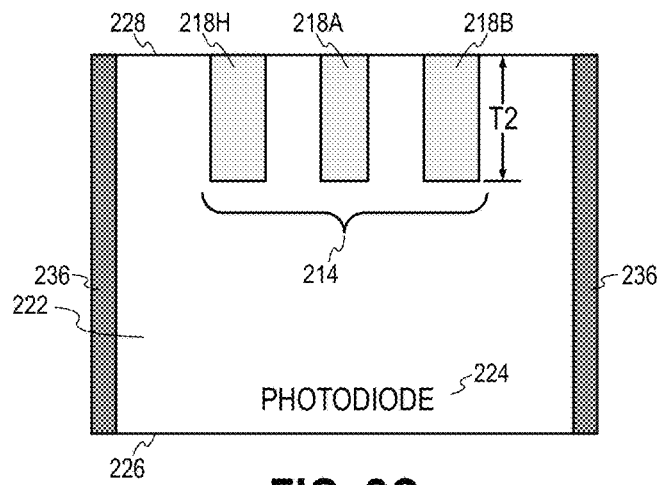
FIG. 2C is an example cross-section view of a pixel cell offset from the central portion and through non-coplanar outer portions of the example cell deep trench isolation structure of FIG. 2A in accordance with the teachings of the present invention.

FIG. 2C is an example cross-section view of a pixel cell 204 offset from the central portion 216 and through non-coplanar outer portions of the example CDTI structure 214 of FIG. 2A in accordance with the teachings of the present invention. In other words, it is appreciated that example pixel cell 204 of FIG. 2C may be another view of example pixel cell 204 of FIG. 2A and FIG. 2B, and that similarly named and numbered elements referenced below are coupled and function as described above. It is noted that the example cross-section view of pixel cell 204 shown in FIG. 2C may correspond to a cross-section view of pixel cell 204 of FIG. 2A along dashed line B-B'.

As shown in the example depicted in FIG. 2C, pixel cell 204 includes photodiode 224 disposed in the pixel cell region of a semiconductor layer 222 and proximate to the front side 226 of the semiconductor layer 222. The CDTI structure 214 is disposed in the pixel cell 204 region of the semiconductor layer 222 proximate to the backside 228 of the semiconductor layer 222. As shown in the illustrated example, the CDTI structure 214 includes a plurality of planar outer portions, of which planar outer portions 218H, 218A, 218B are visible in FIG. 2C. As shown in the illustrated example, planar outer portions 218H, 218A, 218B extend a second depth T2 from the backside 228 towards the front side 226 of the semiconductor layer 222. As mentioned above, in the various examples, a first depth T1 of central portion 216 (see, e.g., FIG. 2B) is greater than the second depth T2 of the plurality of planar outer portions 218H, 218A, 218B due to the etch loading effect when etching the trenches to form CDTI structure 214. In various examples, it is noted that the depths of the planar outer portions 218H, 218A, 218B at the ends that are closer to the central portion 216 may be deeper than the second depth T2 of at outer edges of the plurality of planar outer portions 218H, 218A, 218B. For instance, in one example, the depths of the planar outer portions 218H, 218A, 218B may vary from substantially the same depth as the first depth T1 at the ends that are closest to the central portion 216 to the second depth T2 at the outer edges of the plurality of planar outer portions 218H, 218A, 218B. In one embodiment, the difference between the first depth T1 of central portion 216 and the second depth T2 of the plurality of planar outer portions 218H, 218A, 218B may be in a range between 5 nm to 200 nm.

The example cross-section view illustrated in FIG. 2C also shows the BDTI structure 236 that surrounds the pixel cell 204 region of the semiconductor layer 222. As illustrated in the depicted example, the BDTI structure 236 extends from the backside 228 to the front side 226 of the semiconductor layer 222, which isolates or separates each of the pixel cells 204 from neighboring pixel cells in the pixel array.

Figure 2D:
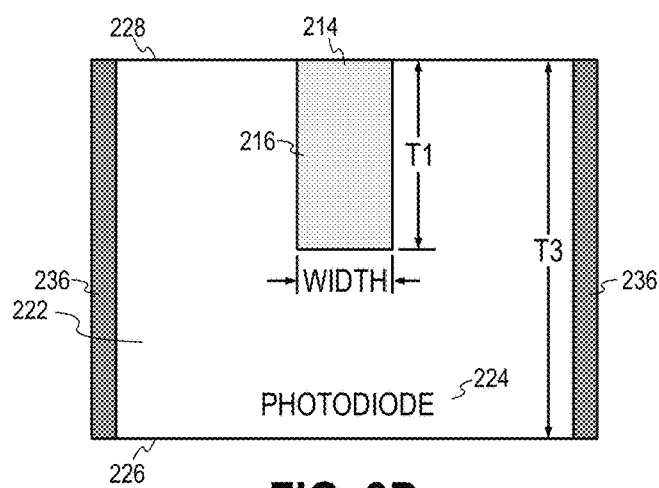
FIG. 2D is an example cross-section view of a pixel cell through the central portion and between planar outer portions of the example cell deep trench isolation structure of FIG. 2A in accordance with the teachings of the present invention.

FIG. 2D is an example cross-section view of a pixel cell 204 through the central portion 216 and between planar outer portions of the example CDTI structure of FIG. 2A in accordance with the teachings of the present invention. In other words, it is appreciated that example pixel cell 204 of FIG. 2D may be another view of example pixel cell 204 of FIG. 2A, FIG. 2B, and FIG. 2C, and that similarly named and numbered elements referenced below are coupled and function as described above. It is noted that the example cross-section view of pixel cell 204 shown in FIG. 2D may correspond to a cross-section view of pixel cell 204 of FIG. 2A along dashed line C-C'.

As shown in the example depicted in FIG. 2C, pixel cell 204 includes photodiode 224 disposed in the pixel cell region of a semiconductor layer 222 and proximate to the front side 226 of the semiconductor layer 222. The CDTI structure 214 is disposed in the pixel cell 204 region of the semiconductor layer 222 proximate to the backside 228 of the semiconductor layer 222. As shown in the illustrated example, the CDTI structure 214 includes central portion 216, which extends a first depth T1 from the backside 228 towards the front side 226 of the semiconductor layer 222. It is noted that some of the plurality of planar outer portions 218 are not visible in FIG. 2D. As mentioned above, in the various examples, the width of the central portion 216 is greater than the thickness of the plurality of planar outer portions 218 (see, e.g., FIG. 2A), and as such the first depth T1 of central portion 216 is greater than the second depth T2 of the plurality of planar outer portions 218 due to the etch loading effect when etching the trenches to form CDTI structure 214.

The example cross-section view illustrated in FIG. 2D also shows the BDTI structure 236 that surrounds the pixel cell 204 region of the semiconductor layer 222. As illustrated in the depicted example, the BDTI structure 236 extends a third depth T3 from the backside 228 to the front side 226 of the semiconductor layer 222, which isolates or separates each of the pixel cells 204 from neighboring pixel cells in the pixel array. In the depicted example, the third depth T3 is substantially equal to the thickness of the semiconductor layer 222 between the backside 228 and the front side 226. In another example, it is appreciated that the third depth T3 may be greater than the first depth T1 of the central portion 216 and less than the thickness of the semiconductor layer 222 between the backside 228 and the front side 226.

Figure 3A:
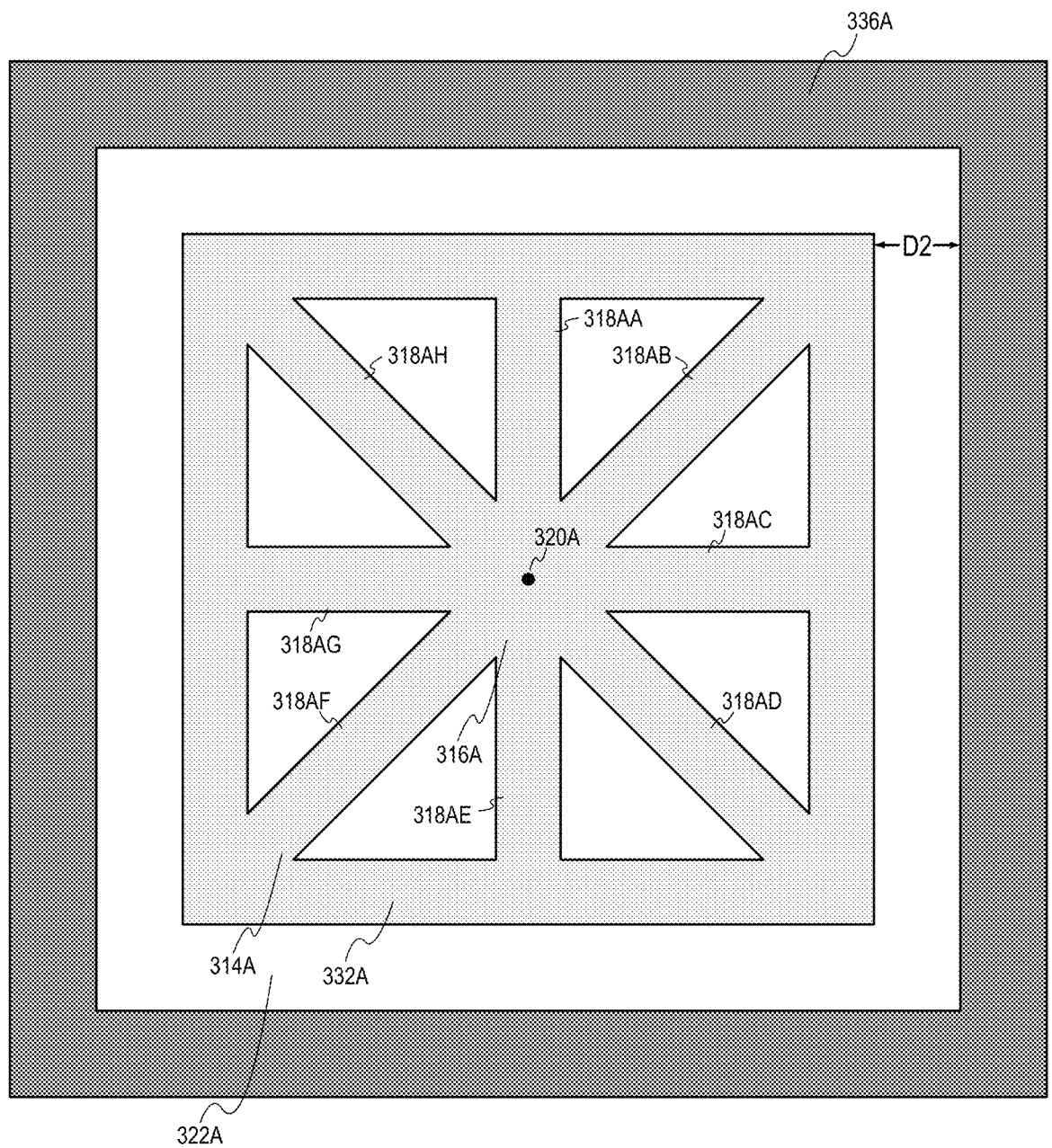
FIG. 3A is an example top view a pixel cell illustrating another example of cell deep trench isolation structure in accordance with the teachings of the present invention.

FIG. 3A is an example top view a pixel cell 304A illustrating another example of a CDTI structure in accordance with the teachings of the present invention. It is noted that example pixel cell 304A of FIG. 3A may be another example of one or more of the pixel cells 104 of the example pixel array 102 of FIG. 1, and it should be appreciated that similarly named and numbered elements referenced below are coupled and function as described above. In addition, it is further appreciated that example pixel cell 304A of FIG. 3A shares many similarities with example pixel cell 204 of FIG. 2A.

For instance, as shown in the example depicted in FIG. 3A, pixel cell 304A includes a CDTI structure 314A disposed in a pixel cell 304A region of the semiconductor layer 322A. In one example, CDTI structure 314A is formed with a low k material, an oxide material, or other suitable dielectric material in the semiconductor layer 322A. In one example, the semiconductor layer 322A may include silicon or another suitable type of semiconductor material. As shown, CDTI structure 314A includes a central portion 316A and a plurality of planar outer portions 318AA, 318AB, 318AC, 318AD, 318AE, 318AF, 318AG, 318AH that extend laterally outward from the central portion 316A in the semiconductor layer 322A. Planes that are formed with the plurality of planar outer portions 318AA, 318AB, 318AC, 318AD, 318AE, 318AF, 318AG, 318AH intersect in a line that is coincident or overlaps with a longitudinal center line 320A of the central portion 316A of the CDTI structure 314A. It is noted that the longitudinal center line 320A is a line that extends into or out from the page, and is therefore illustrated as a point in FIG. 3A. It is noted that in the example illustrated in FIG. 3A that the plurality of planar outer portions includes at least eight planar outer portions 318AA, 318AB, 318AC, 318AD, 318AE, 318AF, 318AG, 318AH. It is also noted that the plurality of planar outer portions includes pairs of planar outer portions that are coplanar. For instance, in the example depicted in FIG. 3A, there are four pairs of planar outer portions shown, which form coplanar outer portion pairs 318AA/318AE, 318AB/318AF, 318AC/318AG, 318AD/318AH. Pixel cell 304A of FIG. 3A also includes a BDTI structure 336A that surrounds the pixel cell 304A region of the semiconductor layer 322A. In the example, the BDTI structure 336A isolates or separates the pixel cell 304A from neighboring pixel cells in the pixel array.

One of the differences between pixel cell 304A of FIG. 3A and pixel cell 204 of FIG. 2A is that the CDTI structure 314A of pixel cell 304A of FIG. 3A further includes a perimeter portion 332A surrounding the plurality of planar outer portions 318AA, 318AB, 318AC, 318AD, 318AE, 318AF, 318AG, 318AH and the central portion 316A in the semiconductor layer 322A. As such, the perimeter portion 332A is in contact with outer ends of the plurality of planar outer portions 318AA, 318AB, 318AC, 318AD, 318AE, 318AF, 318AG, 318AH in the semiconductor layer 322A. In the example depicted in FIG. 3A, it is noted that perimeter portion 332A has a "box" or "square" shape in the semiconductor layer 322A for explanation purposes. In other examples, it is appreciated that perimeter portion 332A may have other shapes such as a "circular" shape, "oval" shape, or another suitable shape that surrounds the plurality of planar outer portions 318AA, 318AB, 318AC, 318AD, 318AE, 318AF, 318AG, 318AH. FIG. 3A shows that in one example, the outer edge of the perimeter portion 332A is spaced apart and separated from the BDTI structure 336A by the second distance D2. In one example, the second distance D2 is in an approximate range of 200 to 300 nm. In one embodiment, the BDTI structure 336A extends from the backside a depth into the semiconductor layer 322A toward the front side of the semiconductor layer 322A greater than CDTI structure 314A to form a partial backside deep trench isolation structure. The BDTI structure 336A may be formed of a low k material, an oxide material, or other suitable dielectric material in the semiconductor layer 322A. The BDTI structure 336A may be formed with the same or different material as the CDTI structure 314A.

Figure 3B:
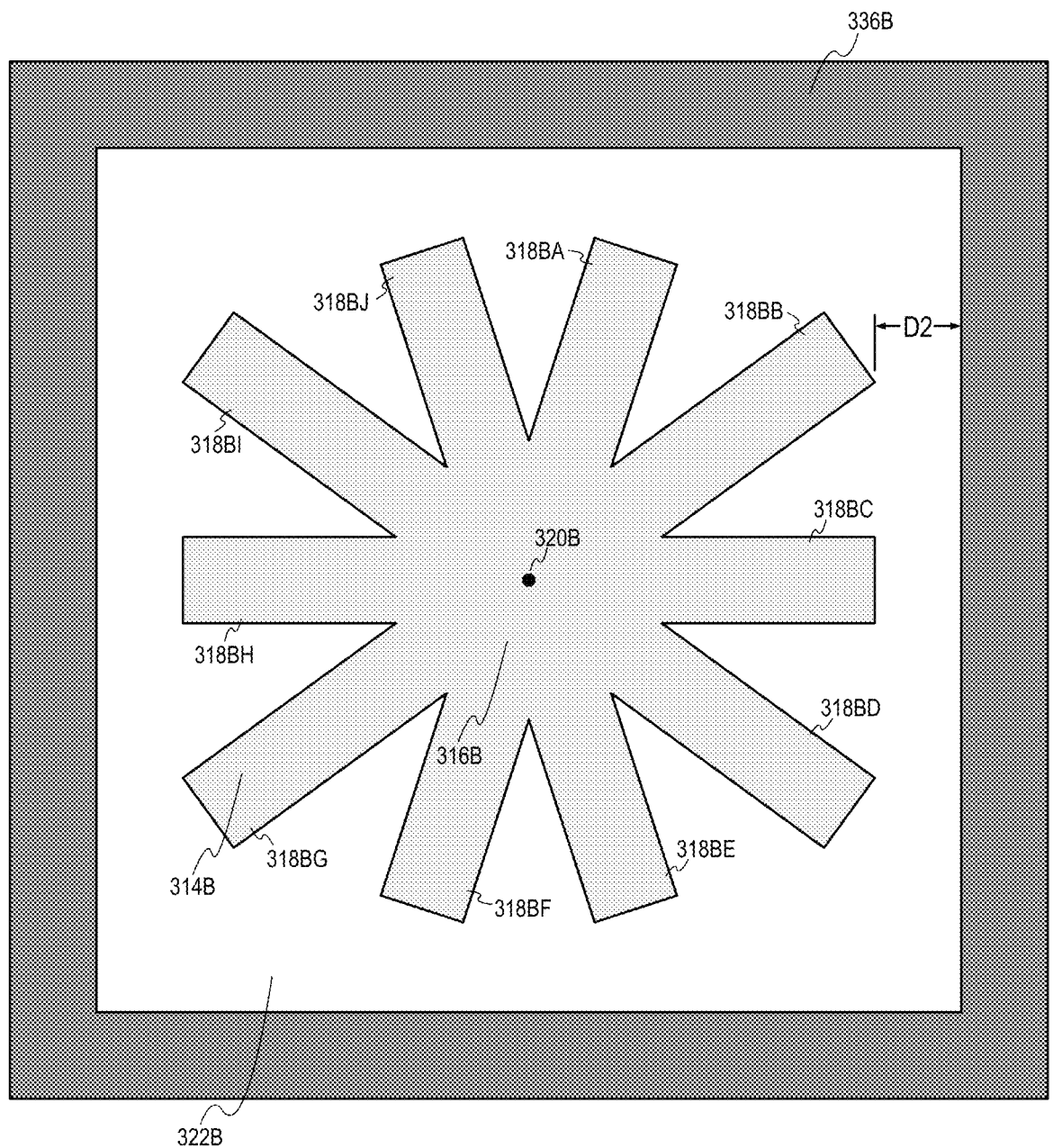
FIG. 3B is an example top view a pixel cell illustrating yet another example of cell deep trench isolation structure in accordance with the teachings of the present invention.

FIG. 3B is an example top view a pixel cell 304B illustrating yet another example of a cell deep trench isolation structure in accordance with the teachings of the present invention. It is noted that example pixel cell 304B of FIG. 3B may be another example of one or more of the pixel cells 104 of the example pixel array 102 of FIG. 1, and it should be appreciated that similarly named and numbered elements referenced below are coupled and function as described above. In addition, it is further appreciated that example pixel cell 304B of FIG. 3B shares many similarities with example pixel cell 204 of FIG. 2A.

For instance, as shown in the example depicted in FIG. 3B, pixel cell 304B includes a CDTI structure 314B disposed in a pixel cell 304B region of the semiconductor layer 322B. In one example, CDTI structure 314B is formed with a low k material, an oxide material, or other suitable dielectric material in the semiconductor layer 322B. In one example, the semiconductor layer 322B may include silicon or another suitable type of semiconductor material. As shown, CDTI structure 314B includes a central portion 316B. One of the differences between pixel cell 304B of FIG. 3B and pixel cell 204 of FIG. 2A is that the CDTI structure 314B of pixel cell 304B of FIG. 3B includes a plurality of ten planar outer portions 318BA, 318BB, 318BC, 318BD, 318BE, 318BF, 318BG, 318BH, 318BI, 318BJ that extend laterally outward from the central portion 316B in the semiconductor layer 322B. In comparison, the example CDTI structure 214 of pixel cell 204 illustrated in FIG. 2A includes a plurality of eight planar outer portions 218A, 218B, 218C, 218D, 218E, 218F, 218G, 218H.

Similar to pixel cell 204 of FIG. 2A, planes that are formed with the plurality of planar outer portions 318BA, 318BB, 318BC, 318BD, 318BE, 318BF, 318BG, 318BH, 318BI, 318BJ of FIG. 3B intersect in a line that is coincident or overlaps with a longitudinal center line 320B of the central portion 316B of the CDTI structure 314B. It is noted that the longitudinal center line 320B is a line that extends into or out from the page, and is therefore illustrated as a point in FIG. 3B. It is also noted that in the example depicted in FIG. 3B, there are five pairs of planar outer portions shown, which form coplanar outer portion pairs 318BA/318BF, 318BB/318BG, 318BC/318BH, 318BD/318BI, 318BE/318BJ. Pixel cell 304B of FIG. 3B also includes a BDTI structure 336B that surrounds the pixel cell 304B region of the semiconductor layer 322B. In the example, the BDTI structure 336B isolates or separates the pixel cell 304B from neighboring pixel cells in the pixel array. FIG. 3B shows that in one example, an outer end of each of the plurality of planar outer portions 318BA, 318BB, 318BC, 318BD, 318BE, 318BF, 318BG, 318BH, 318BI, 318BJ is spaced apart and separated from the BDTI structure 336B by an approximately equal second distance D2. In one example, second distance D2 is in an approximate range of 200 to 300 nm.

Figure 3C:
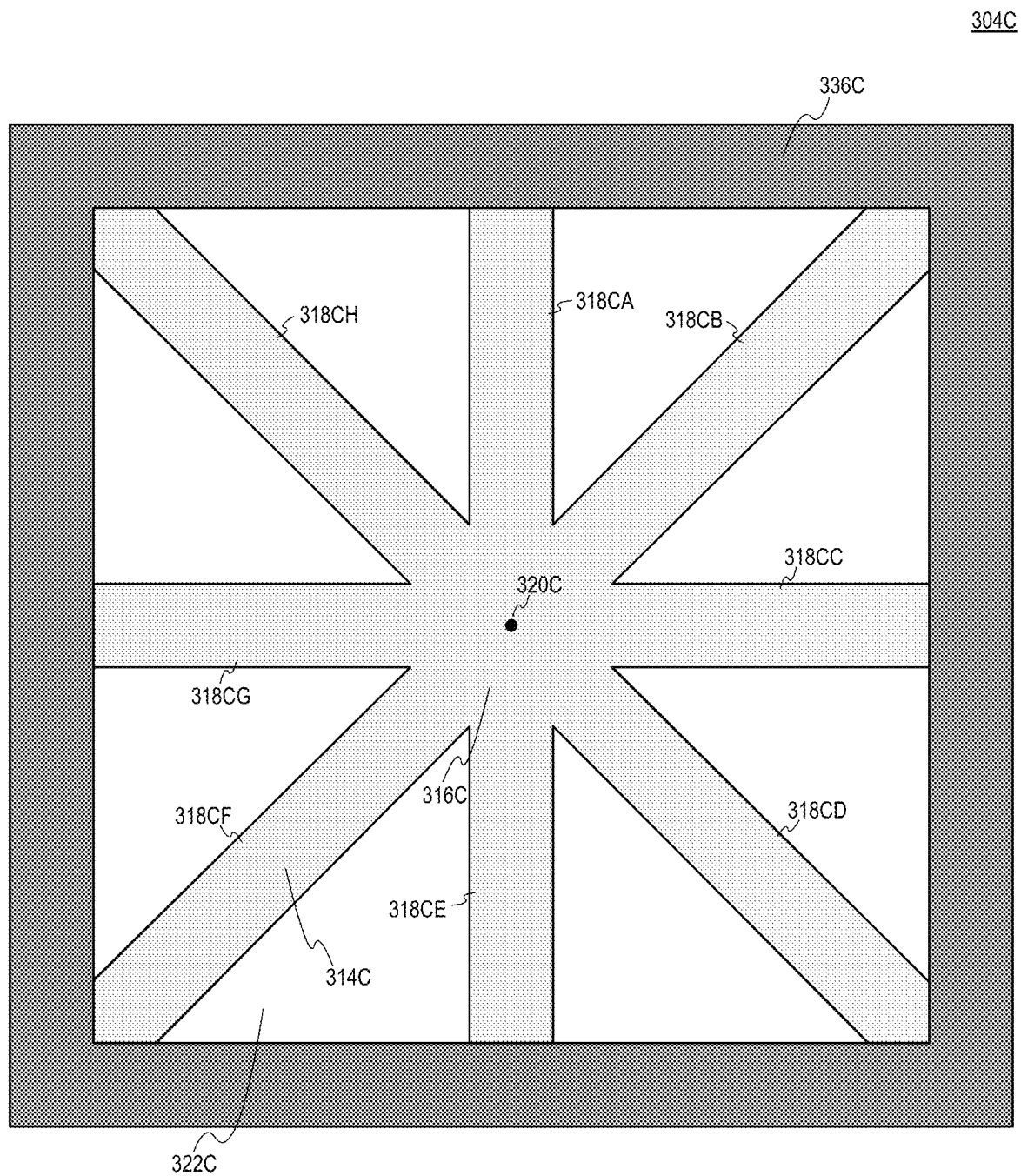
FIG. 3C is an example top view a pixel cell illustrating still another example of cell deep trench isolation structure in accordance with the teachings of the present invention.

FIG. 3C is an example top view a pixel cell 304C illustrating still another example of a CDTI structure in accordance with the teachings of the present invention. It is noted that example pixel cell 304C of FIG. 3C may be another example of one or more of the pixel cells 104 of the example pixel array 102 of FIG. 1, and it should be appreciated that similarly named and numbered elements referenced below are coupled and function as described above. In addition, it is further appreciated that example pixel cell 304C of FIG. 3C also shares many similarities with example pixel cell 204 of FIG. 2A.

For instance, as shown in the example depicted in FIG. 3C, pixel cell 304C includes a CDTI structure 314C disposed in a pixel cell 304C region of the semiconductor layer 322C. In one example, CDTI structure 314C is formed with a low k material, an oxide material, or other suitable dielectric material in the semiconductor layer 322C. In one example, the semiconductor layer 322C may include silicon or another suitable type of semiconductor material. As shown, CDTI structure 314C includes a central portion 316C and a plurality of planar outer portions 318CA, 318CB, 318CC, 318CD, 318CE, 318CF, 318CG, 318CH that extend laterally outward from the central portion 316C in the semiconductor layer 322C. Planes that are formed with the plurality of planar outer portions 318CA, 318CB, 318CC, 318CD, 318CE, 318CF, 318CG, 318CH intersect in a line that is coincident or overlaps with a longitudinal center line 320C of the central portion 316C of the CDTI structure 314C. It is noted that the longitudinal center line 320C is a line that extends into or out from the page, and is therefore illustrated as a point in FIG. 3C. It is noted that in the example illustrated in FIG. 3C that the plurality of planar outer portions includes at least eight planar outer portions 318CA, 318CB, 318CC, 318CD, 318CE, 318CF, 318CG, 318CH. It is also noted that the plurality of planar outer portions includes pairs of planar outer portions that are coplanar. For instance, in the example depicted in FIG. 3C, there are four pairs of planar outer portions shown, which form coplanar outer portion pairs 318CA/318CE, 318CB/318CF, 318CC/318CG, 318CD/318CH. Pixel cell 304C of FIG. 3C also includes a BDTI structure 336C that surrounds the pixel cell 304C region of the semiconductor layer 322C. In the example, the BDTI structure 336C isolates or separates the pixel cell 304C from neighboring pixel cells in the pixel array.

One of the differences between pixel cell 304C of FIG. 3C and pixel cell 204 of FIG. 2A is that in the example shown in FIG. 3C, each of the plurality of planar outer portions 318CA, 318CB, 318CC, 318CD, 318CE, 318CF, 318CG, 318CH extends from the central portion 316C all the way to the BDTI structure 336C such that the second distance D2 referred to in FIG. 2A is equal to zero in FIG. 3C. As such, in the example depicted in FIG. 3C, the plurality of planar outer portions 318CA, 318CB, 318CC, 318CD, 318CE, 318CF, 318CG, 318CH are in contact with and interconnected with the BDTI structure 336C.

Figure 3D:
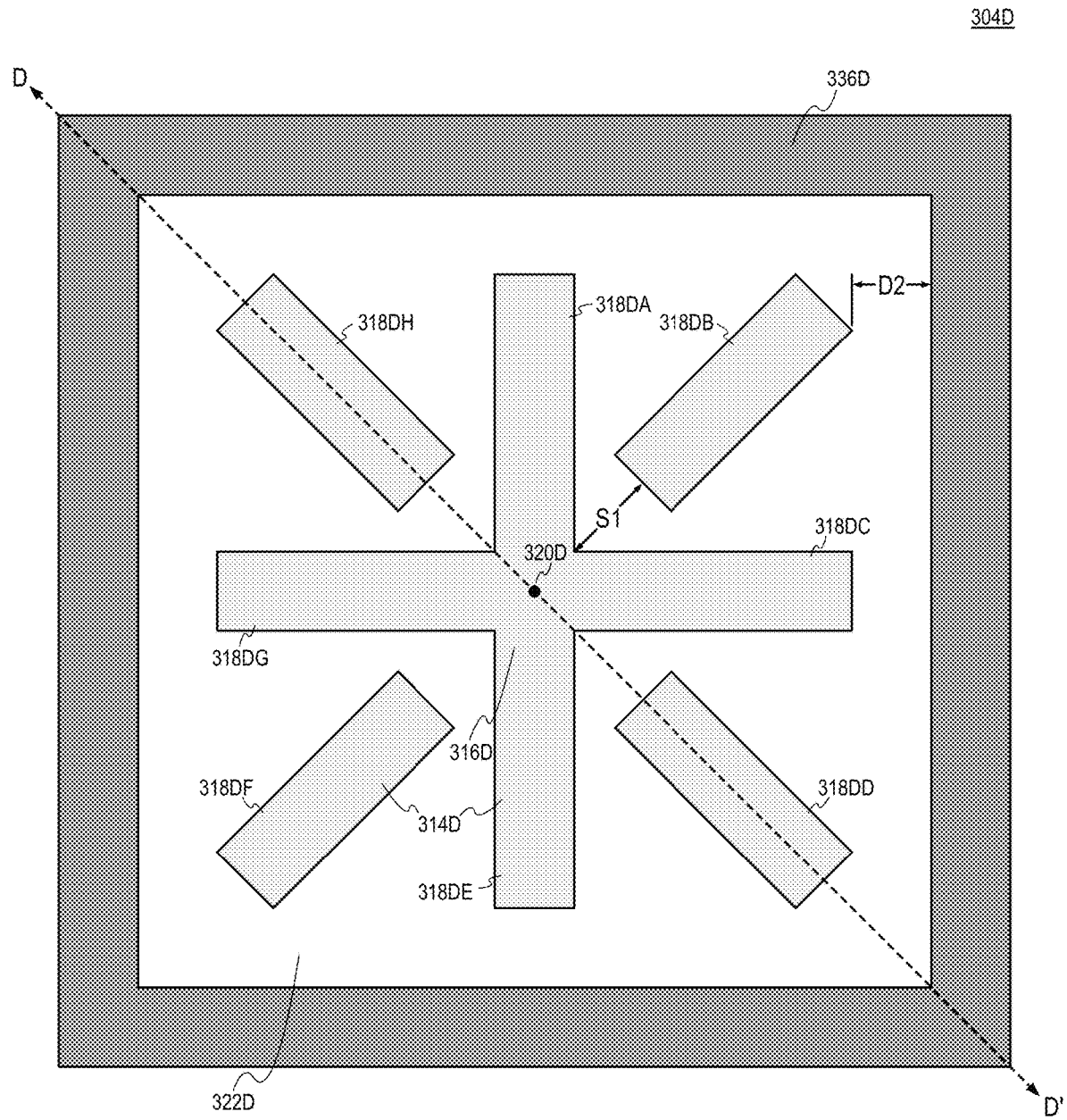
FIG. 3D is an example top view a pixel cell illustrating yet another example of cell deep trench isolation structure in accordance with the teachings of the present invention.

FIG. 3D is an example top view a pixel cell 304D illustrating yet another example of a CDTI structure in accordance with the teachings of the present invention. It is noted that example pixel cell 304D of FIG. 3D may be another example of one or more of the pixel cells 104 of the example pixel array 102 of FIG. 1, and it should be appreciated that similarly named and numbered elements referenced below are coupled and function as described above. In addition, it is further appreciated that example pixel cell 304D of FIG. 3D shares many similarities with example pixel cell 204 of FIG. 2A.

For instance, as shown in the example depicted in FIG. 3D, pixel cell 304D includes a CDTI structure 314D disposed in a pixel cell 304D region of the semiconductor layer 322D. As shown, CDTI structure 314D includes a central portion 316D and a plurality of planar outer portions 318DA, 318DB, 318DC, 318DD, 318DE, 318DF, 318DG, 318DH that extend laterally outward from the central portion 316D in the semiconductor layer 322D. Planes that are formed with the plurality of planar outer portions 318DA, 318DB, 318DC, 318DD, 318DE, 318DF, 318DG, 318DH intersect in a line that is coincident or overlaps with a longitudinal center line 320D of the central portion 316D of the CDTI structure 314D. It is noted that the longitudinal center line 320D is a line that extends into or out from the page, and is therefore illustrated as a point in FIG. 3D. It is noted that in the example illustrated in FIG. 3D that the plurality of planar outer portions includes at least eight planar outer portions 318DA, 318DB, 318DC, 318DD, 318DE, 318DF, 318DG, 318DH. It is also noted that the plurality of planar outer portions includes pairs of planar outer portions that are coplanar. For instance, in the example depicted in FIG. 3D, there are four pairs of planar outer portions shown, which form coplanar outer portion pairs 318DA/318DE, 318DB/318DF, 318DC/318DG, 318DD/318DH.

Pixel cell 304D of FIG. 3D also includes a BDTI structure 336D that surrounds the pixel cell 304D region of the semiconductor layer 322D. In the example, the BDTI structure 336D isolates or separates the pixel cell 304D from neighboring pixel cells in the pixel array. FIG. 3D shows that in one example, an outer end of each of the plurality of planar outer portions 318D is spaced apart and separated from the BDTI structure 336D by an approximately equal second distance D2. In one example, the second distance D2 is in an approximate range of 200 to 300 nm. The BDTI structure 336D may be formed of a low k material, an oxide material, or other suitable dielectric material in the semiconductor layer 322D. The BDTI structure 336D may be formed with the same or different material as the CDTI structure 314D.

One of the differences between pixel cell 304D of FIG. 3D and pixel cell 204 of FIG. 2A is that for a first subset of the plurality of planar outer portions, which in the embodiment illustrated in FIG. 3D includes the planar outer portions 318DB, 318DD, 318DF, 318DH, the inner ends or the ends of these planar outer portions 318DB, 318DD, 318DF, 318DH that are closer to the central portion 316D are laterally offset from the central portion 316D by a lateral offset distance S1 as shown. In other words, the inner ends of planar outer portions 318DB, 318DD, 318DF, 318DH of CDTI structure 314D are spaced apart and separated from the central portion 316D of CDTI structure 314D by the lateral offset distance S1. In the example, the first subset of the planar outer portions includes every other planar outer portion. In comparison, the inner ends of a second subset of the plurality of planar outer portions, which in the example includes the other remaining planar outer portions 318DA, 318DE, 318DC, 318DG of CDTI structure 314D are in contact with and/or integrated with the central portion 316D of CDTI structure 314D. In the example, the second subset of the planar outer portions includes the planar outer portions that are not included in the first subset of the plurality of planar portions. In the depicted example, it is appreciated that the planar outer portions 318DA, 318DE, 318DC, 318DG of CDTI structure 314D that are in contact with and/or integrated with the central portion 316D of CDTI structure 314D extend outward laterally from the central portion 316D towards the sides of the pixel cell 304D and that the planar outer portions 318DB, 318DD, 318DF, 318DH that are laterally offset from the central portion 316D extend outward laterally from the central portion 316D towards the corners along the diagonal of the pixel cell 304D.

Figure 3E:
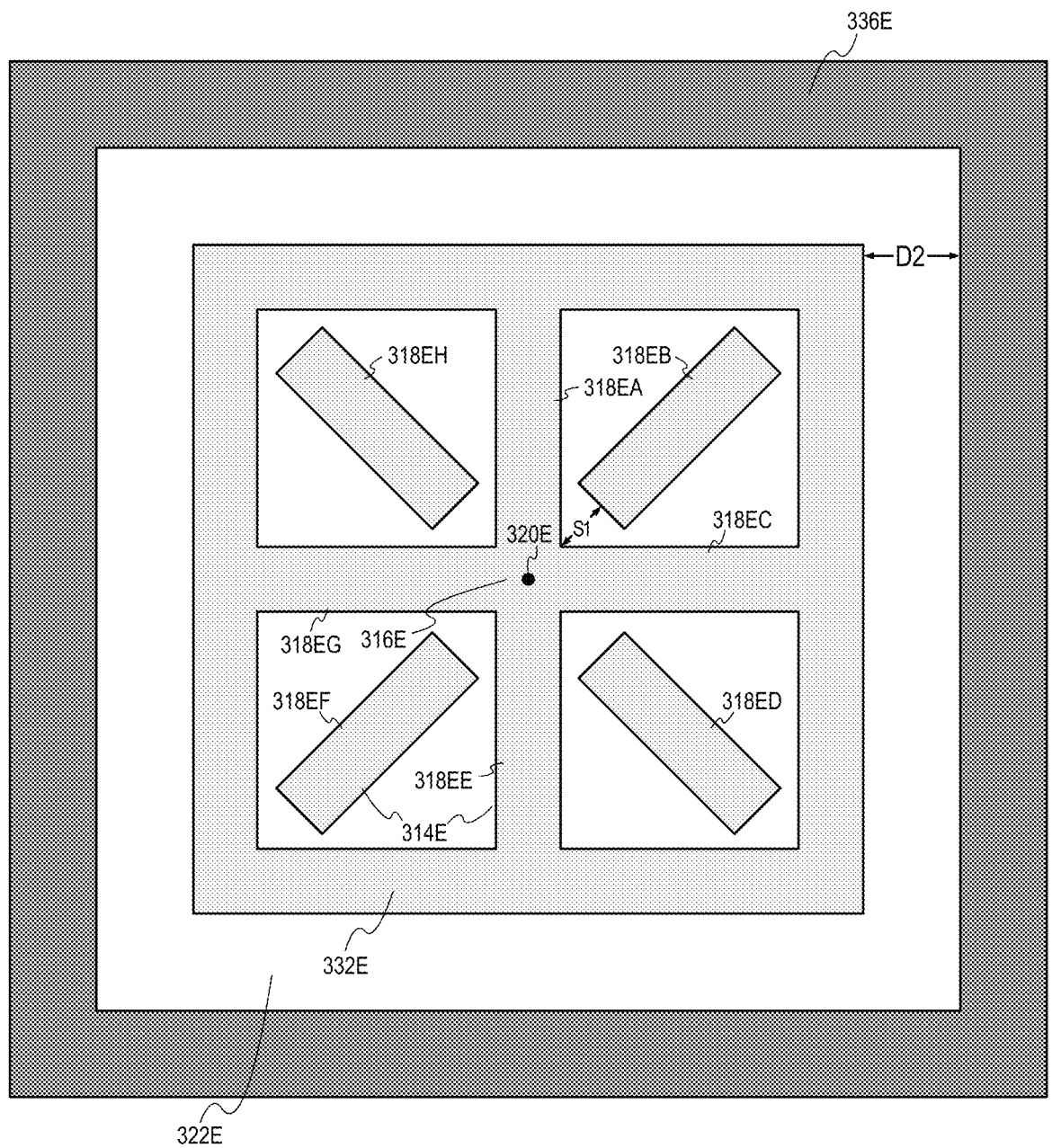
FIG. 3E is an example top view a pixel cell illustrating still another example of cell deep trench isolation structure in accordance with the teachings of the present invention.

FIG. 3E is an example top view a pixel cell 304E illustrating still another example of a CDTI structure in accordance with the teachings of the present invention. It is noted that example pixel cell 304E of FIG. 3E may be another example of one or more of the pixel cells 104 of the example pixel array 102 of FIG. 1, and it should be appreciated that similarly named and numbered elements referenced below are coupled and function as described above. In addition, it is further appreciated that example pixel cell 304E of FIG. 3E shares many similarities with example pixel cell 304D of FIG. 3D.

For instance, as shown in the example depicted in FIG. 3E, pixel cell 304E includes a CDTI structure 314E disposed in a pixel cell 304E region of the semiconductor layer 322E. As shown, CDTI structure 314E includes a central portion 316E and a plurality of planar outer portions 318EA, 318EB, 318EC, 318ED, 318EE, 318EF, 318EG, 318EH that extend laterally outward from the central portion 316E in the semiconductor layer 322E. Planes that are formed with the plurality of planar outer portions 318EA, 318EB, 318EC, 318ED, 318EE, 318EF, 318EG, 318EH intersect in a line that is coincident or overlaps with a longitudinal center line 320E of the central portion 316E of the CDTI structure 314E. It is noted that the longitudinal center line 320E is a line that extends into or out from the page, and is therefore illustrated as a point in FIG. 3E. It is noted that in the example illustrated in FIG. 3E that the plurality of planar outer portions includes at least eight planar outer portions 318EA, 318EB, 318EC, 318ED, 318EE, 318EF, 318EG, 318EH. It is also noted that the plurality of planar outer portions includes pairs of planar outer portions that are coplanar. For instance, in the example depicted in FIG. 3E, there are four pairs of planar outer portions shown, which form coplanar outer portion pairs 318EA/318EE, 318EB/318EF, 318EC/318EG, 318ED/318EH.

Pixel cell 304E of FIG. 3E also includes a BDTI structure 336E that surrounds the pixel cell 304E region of the semiconductor layer 322E. In the example, the BDTI structure 336E isolates or separates the pixel cell 304E from neighboring pixel cells in the pixel array. The BDTI structure 336E may be formed of a low k material, an oxide material, or other suitable dielectric material in the semiconductor layer 322E. The BDTI structure 336E may be formed with the same or different material as the CDTI structure 314E.

Similar to pixel cell 304D of FIG. 3D, for a first subset of the plurality of planar outer portions, which in the embodiment depicted in FIG. 3E includes the planar outer portions 318EB, 318ED, 318EF, 318EH of pixel cell 304E, the inner ends or the ends of these planar outer portions 318EB, 318ED, 318EF, 318EH that are closer to the central portion 316E are laterally offset from the central portion 316E by a lateral offset distance S1 as shown. In other words, the inner ends of planar outer portions 318EB, 318ED, 318EF, 318EH of CDTI structure 314E are spaced apart and separated from the central portion 316E of CDTI structure 314E by the lateral offset distance S1. In the example, the first subset of the planar outer portions includes every other planar outer portion. In comparison, the inner ends of a second subset of the plurality of planar outer portions, which in the example includes the other remaining planar outer portions 318EA, 318EC, 318EE, 318EG of CDTI structure 314E are in contact with and/or integrated with the central portion 316E of CDTI structure 314E. In the depicted example, it is appreciated that the planar outer portions 318EA, 318DC, 318EE, 318EG of CDTI structure 314E that are in contact with and/or integrated with the central portion 316E of CDTI structure 314E extend outward laterally from the central portion 316D towards the sides of the pixel cell 304E and that the planar outer portions 318EB, 318ED, 318EF, 318EH that are laterally offset from the central portion 316D extend outward laterally from the central portion 316E towards the corners along the diagonal of the pixel cell 304E.

One of the differences between pixel cell 304E of FIG. 3E and pixel cell 304D of FIG. 3D is that the CDTI structure 314E of pixel cell 304E of FIG. 3E further includes a perimeter portion 332E surrounding the plurality of planar outer portions 318EA, 318EB, 318EC, 318ED, 318EE, 318EF, 318EG, 318EH and the central portion 316E in the semiconductor layer 322E. As shown in the example depicted in FIG. 3E, the perimeter portion 332E is in contact with outer ends of some of the planar outer portions 318EA, 318EC, 318EE, 318EG in the semiconductor layer 322E. As noted above, the inner ends of these planar outer portions 318EA, 318EC, 318EE, 318EG of CDTI structure 314E are included in the second subset of the plurality of planar outer portions and are also in contact with and/or integrated with the central portion 316E of CDTI structure 314E. In the example, the perimeter portion 332E is spaced apart and separated from the outer ends of the remaining planar outer portions 318EB, 318ED, 318EF, 318EH of CDTI structure 314E. As noted above, the inner ends of these planar outer portions 318EB, 318ED, 318EF, 318EH that are closer to the central portion 316E are included in the first subset of planar outer portions and are laterally offset from the central portion 316E by the lateral offset distance S1.

In the example depicted in FIG. 3E, it is noted that perimeter portion 332E has a "box" or "square" shape in the semiconductor layer 322E for explanation purposes. In other examples, it is appreciated that perimeter portion 332E may have other shapes such as a "circular" shape, "oval" shape, or another suitable shape that surrounds the plurality of planar outer portions 318EA, 318EB, 318EC, 318ED, 318EE, 318EF, 318EG, 318EH. FIG. 3E shows that in one example, the outer edge of the perimeter portion 332E is spaced apart and separated from the BDTI structure 336E by the second distance D2. In one example, the second distance D2 is in an approximate range of 200 to 300 nm.

Figure 3F:
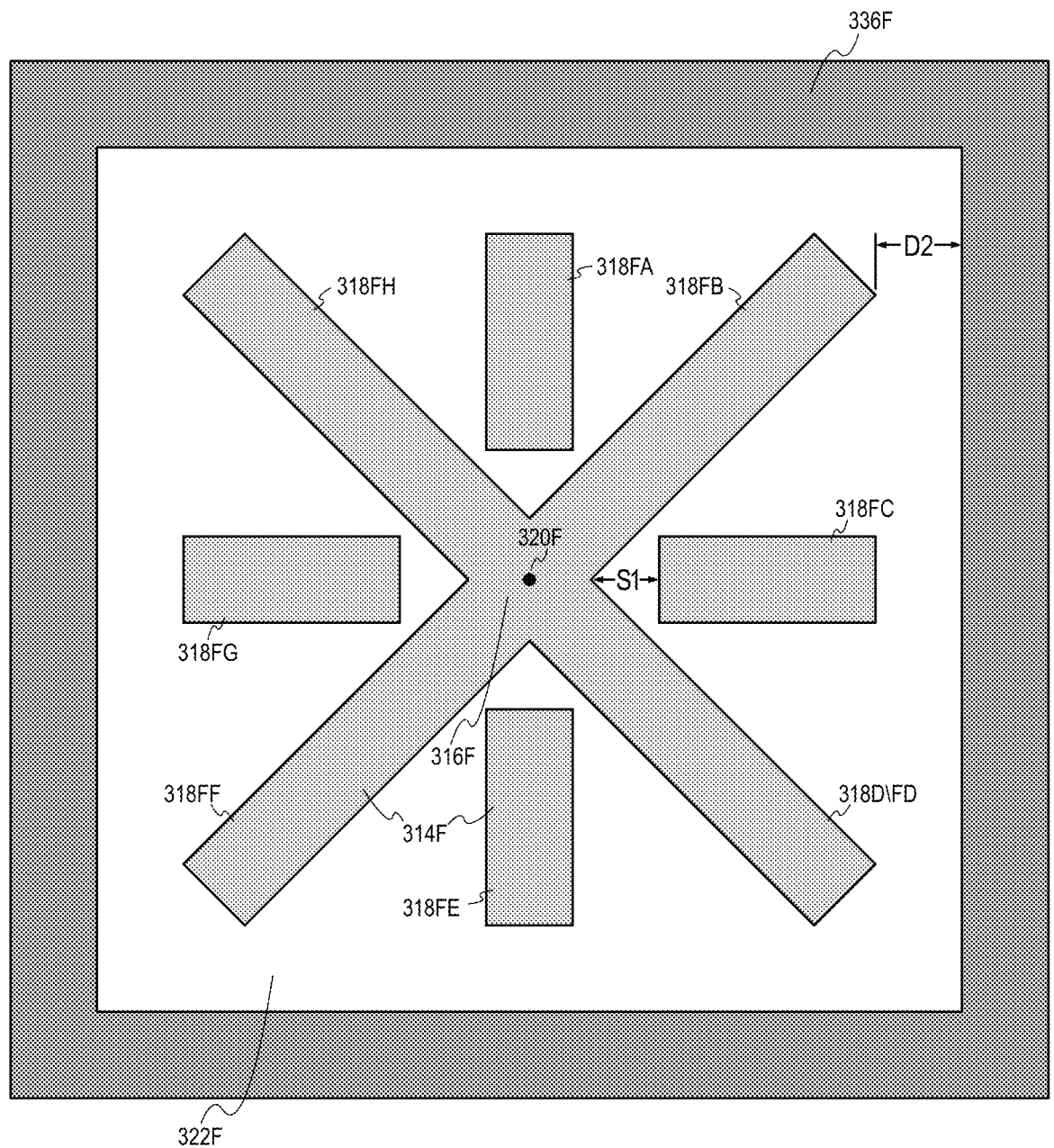
FIG. 3F is an example top view a pixel cell illustrating yet another example of cell deep trench isolation structure in accordance with the teachings of the present invention.

FIG. 3F is an example top view a pixel cell 304F illustrating yet another example of CDTI structure in accordance with the teachings of the present invention. It is noted that example pixel cell 304F of FIG. 3F may be another example of one or more of the pixel cells 104 of the example pixel array 102 of FIG. 1, and it should be appreciated that similarly named and numbered elements referenced below are coupled and function as described above. In addition, it is further appreciated that example pixel cell 304F of FIG. 3F shares many similarities with example pixel cell 304D of FIG. 3D.

For instance, as shown in the example depicted in FIG. 3F, pixel cell 304F includes a CDTI structure 314F disposed in a pixel cell 304F region of the semiconductor layer 322F. As shown, CDTI structure 314F includes a central portion 316F and a plurality of planar outer portions 318FA, 318FB, 318FC, 318FD, 318FE, 318FF, 318FG, 318FH that extend laterally outward from the central portion 316F in the semiconductor layer 322F. Planes that are formed with the plurality of planar outer portions 318FA, 318FB, 318FC, 318FD, 318FE, 318FF, 318FG, 318FH intersect in a line that is coincident or overlaps with a longitudinal center line 320F of the central portion 316F of the CDTI structure 314F. It is noted that the longitudinal center line 320F is a line that extends into or out from the page, and is therefore illustrated as a point in FIG. 3F. It is noted that in the example illustrated in FIG. 3F that the plurality of planar outer portions includes at least eight planar outer portions 318FA, 318FB, 318FC, 318FD, 318FE, 318FF, 318FG, 318FH. It is also noted that the plurality of planar outer portions includes pairs of planar outer portions that are coplanar. For instance, in the example depicted in FIG. 3F, there are four pairs of planar outer portions shown, which form coplanar outer portion pairs 318FA/318FE, 318FB/318FF, 318FC/318FG, 318FD/318FH.

Pixel cell 304F of FIG. 3F also includes a BDTI structure 336F that surrounds the pixel cell 304F region of the semiconductor layer 322F. In the example, the BDTI structure 336F isolates or separates the pixel cell 304F from neighboring pixel cells in the pixel array. FIG. 3F shows that in one example, an outer end of each of the plurality of planar outer portions 318F is spaced apart and separated from the BDTI structure 336F by an approximately equal second distance D2. In one example, the second distance D2 is in an approximate range of 200 to 300 nm. The BDTI structure 336F may be formed of a low k material, an oxide material, or other suitable dielectric material in the semiconductor layer 322F. The BDTI structure 336F may be formed with the same or different material as the CDTI structure 314F.

As shown in the example of pixel cell 304F in FIG. 3F, for a first subset of the plurality of planar outer portions, which in the depicted embodiment includes the planar outer portions 318FA, 318FC, 318FE, 318FG, the inner ends or the ends of these planar outer portions 318FA, 318FC, 318FE, 318FG that are closer to the central portion 316F are laterally offset from the central portion 316F by a lateral offset distance S1 as shown. In other words, the inner ends of planar outer portions 318FA, 318FC, 318FE, 318FG of CDTI structure 314F are spaced apart and separated from the central portion 316F of CDTI structure 314F by the lateral offset distance S1. In the example, the first subset of the planar outer portions includes every other planar outer portion. In comparison, the inner ends of a second subset of the plurality of planar outer portions, which in the example includes the other remaining planar outer portions 318FB, 318FD, 318FF, 318FH of CDTI structure 314F are in contact with and/or integrated with the central portion 316F of CDTI structure 314F. One of the differences between pixel cell 304F of FIG. 3F and pixel cell 304D of FIG. 3D is that the planar outer portions 318FB, 318FD, 318FF, 318FH of CDTI structure 314F that are in contact with and/or integrated with the central portion 316F of CDTI structure 314F extend outward laterally from the central portion 316F towards the corners along the diagonal of the pixel cell 304F and that the planar outer portions 318FA, 318FC, 318FE, 318FG that are laterally offset from the central portion 316F extend outward laterally from the central portion 316F towards the sides of the pixel cell 304F.

Figure 3G:
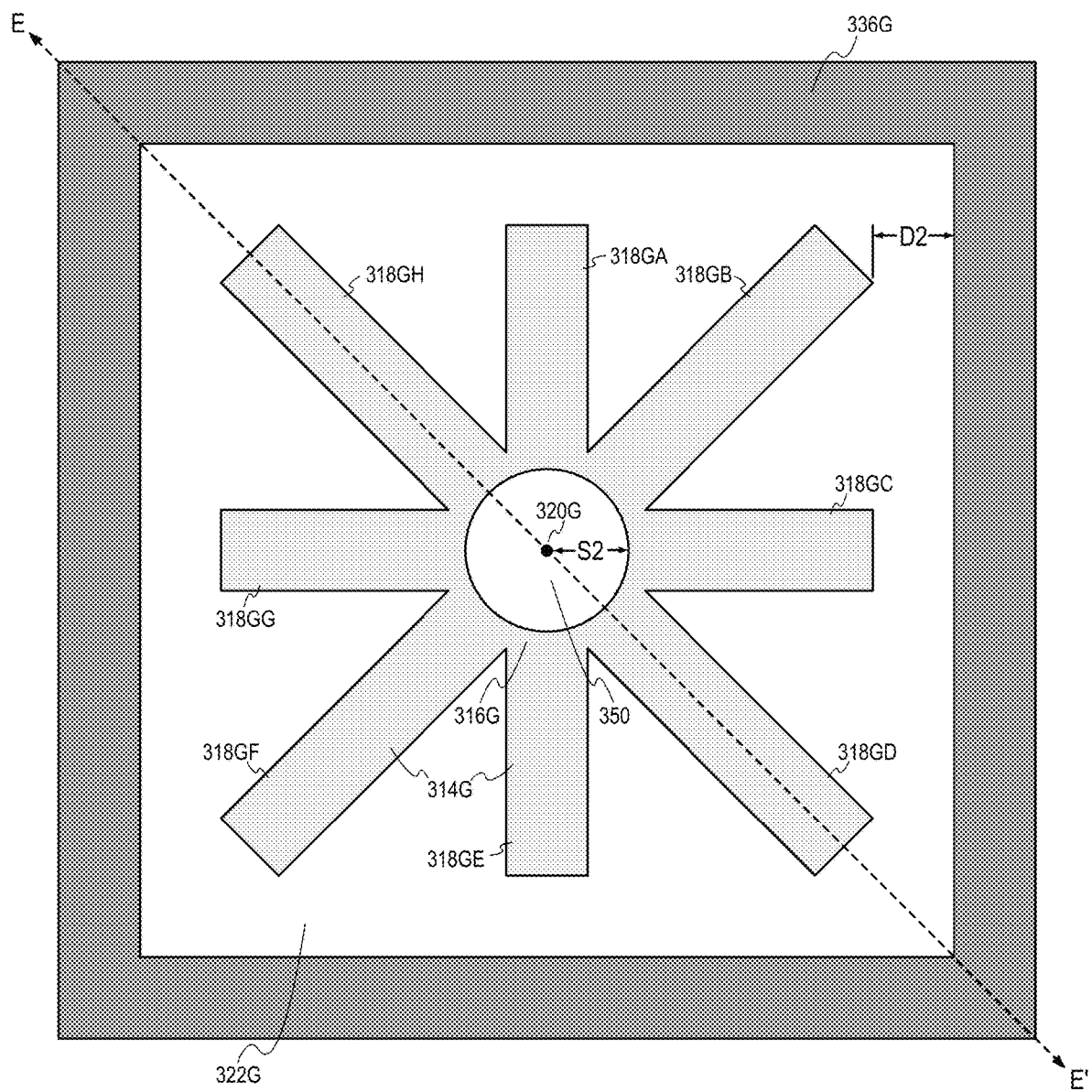
FIG. 3G is an example top view a pixel cell illustrating still another example of cell deep trench isolation structure in accordance with the teachings of the present invention.

FIG. 3G is an example top view a pixel cell 304G illustrating still another example of a CDTI structure in accordance with the teachings of the present invention. It is noted that example pixel cell 304G of FIG. 3G may be another example of one or more of the pixel cells 104 of the example pixel array 102 of FIG. 1, and it should be appreciated that similarly named and numbered elements referenced below are coupled and function as described above. In addition, it is further appreciated that example pixel cell 304G of FIG. 3G shares many similarities with example pixel cell 204 of FIG. 2A.

For instance, as shown in the example depicted in FIG. 3G, pixel cell 304G includes a CDTI structure 314G disposed in a pixel cell 304G region of the semiconductor layer 322G. As shown, CDTI structure 314G includes a central portion 316G and a plurality of planar outer portions 318GA, 318GB, 318GC, 318GD, 318GE, 318GF, 318GG, 318GH that extend laterally outward from the central portion 316G in the semiconductor layer 322G. Planes that are formed with the plurality of planar outer portions 318GA, 318GB, 318GC, 318GD, 318GE, 318GF, 318GG, 318GH intersect in a line that is coincident or overlaps with a longitudinal center line 320G of the central portion 316G of the CDTI structure 314G. It is noted that the longitudinal center line 320G is a line that extends into or out from the page, and is therefore illustrated as a point in FIG. 3G. It is noted that in the example illustrated in FIG. 3G that the plurality of planar outer portions includes at least eight planar outer portions 318GA, 318GB, 318GC, 318GD, 318GE, 318GF, 318GG, 318GH. It is also noted that the plurality of planar outer portions includes pairs of planar outer portions that are coplanar. For instance, in the example depicted in FIG. 3G, there are four pairs of planar outer portions shown, which form coplanar outer portion pairs 318GA/318GE, 318GB/318GF, 318GC/318GG, 318GD/318GH.

Pixel cell 304G of FIG. 3G also includes a BDTI structure 336G that surrounds the pixel cell 304G region of the semiconductor layer 322G. In the example, the BDTI structure 336G isolates or separates the pixel cell 304G from neighboring pixel cells in the pixel array. FIG. 3G shows that in one example, an outer end of each of the plurality of planar outer portions 318G is spaced apart and separated from the BDTI structure 336G by an approximately equal second distance D2. In one example, the second distance D2 is in an approximate range of 200 to 300 nm. The BDTI structure 336G may be formed of a low k material, an oxide material, or other suitable dielectric material in the semiconductor layer 322G. The BDTI structure 336G may be formed with the same or different material as the CDTI structure 314G.

One of the differences between pixel cell 304G of FIG. 3G and pixel cell 204 of FIG. 2A is that an opening 350 is formed in the central portion 316G of CDTI structure 314G of pixel cell 304G of FIG. 3G. As shown in the example, the opening 350 is centered and aligned with the longitudinal center line 320G of the central portion 316G of the CDTI structure 314G. In the example, the opening 350 is substantially circular in shape and is filled with the semiconductor material of semiconductor layer 322G. In one example, the opening 350 has a radius of S2, which in various examples may be in a range of 5 to 250 nm. In other examples, it is appreciated that the radius S2 of opening 350 may have other values and that the opening 350 may have other shapes (e.g., square) that are centered and aligned with the longitudinal center line 320G in central portion 316G of CDTI structure 314G. In one example, incident light that travels to the pixel cell 304G may include at least a first portion of light that travels or passes through the opening 350 of the CDTI structure 314G and a second portion that travels between planar outer portions 318GA, 318GB, 318GC, 318GD, 318GE, 318GF, 318GG, 318GH. Thus, CDTI structure 314G increases light absorption and enhances light sensitivity of the respective pixel cell 304G to, for example, incident light with longer wavelengths (e.g., red light, NIR light, and/or IR light).

Figure 3H:
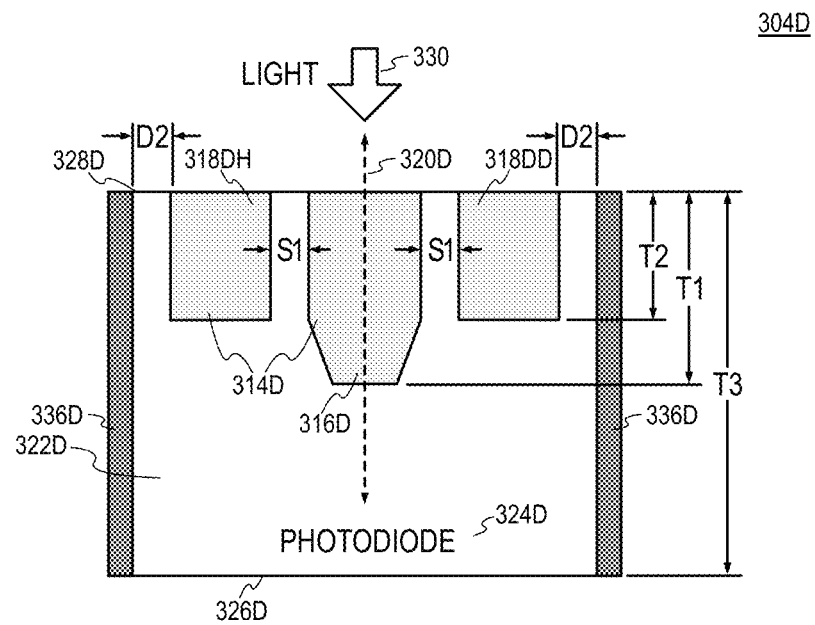
FIG. 3H is an example cross-section view through a central portion and a coplanar pair of outer portions of the example cell deep trench isolation structure of FIG. 3D in accordance with the teachings of the present invention.

FIG. 3H is an example cross-section view of pixel cell 304D through the central portion 316D and the coplanar pair of outer portions 318DD and 318DH of the example CDTI structure 314D of FIG. 3D in accordance with the teachings of the present invention. In other words, it is appreciated that the example pixel cell 304D of FIG. 3H may be another view of example pixel cell 304D of FIG. 3D, and that similarly named and numbered elements referenced below are coupled and function as described above. It is noted that the example cross-section view of pixel cell 304D shown in FIG. 3H may correspond to a cross-section view of pixel cell 304D of FIG. 3D along dashed line D-D'.

As shown in the example depicted in FIG. 3H, pixel cell 304D includes a photodiode 324D disposed in a pixel cell region of a semiconductor layer 322D and proximate to a front side 326D of the semiconductor layer 322D to generate image charge in response to incident light 330 that is directed through a backside 328D of the semiconductor layer 322D to the photodiode 324D. The CDTI structure 314D is disposed in the pixel cell 304D region of the semiconductor layer 322D along an optical path of the incident light 330 to the photodiode 324D and proximate to a backside 328D of the semiconductor layer 322D. As shown in the illustrated example, the CDTI structure 314D includes a central portion 316D, which extends a first depth T1 from the backside 328D towards the front side 326D of the semiconductor layer 322D. The CDTI structure 314D also includes a plurality of planar outer portions, of which planar outer portions 318DD, 318DH are visible in FIG. 3H, and which extend laterally outward from the central portion 316D in the semiconductor layer 322D. As shown in the example depicted in FIG. 3H, planar outer portions 318DB, 318DH are laterally offset from the central portion 316D by the lateral offset distance S1 as shown. In other words, the inner ends of planar outer portions 318DD, 318DH of CDTI structure 314D are spaced apart and separated from the central portion 316D of CDTI structure 314D by the lateral offset distance S1. In one example, the lateral offset distance S1 may be in a range of 5 to 250 nm. In other examples, it is appreciated that the lateral offset distance S1 may have other values.

As shown in the illustrated example, planar outer portions 318DD, 318DH extend a second depth T2 from the backside 328D towards the front side 326D of the semiconductor layer 322D. In the various examples, the width of the central portion 316D is greater than the thickness of the planar outer portions 318DD, 318DH and as such, the first depth T1 of central portion 316D is greater than the second depth T2 of the plurality of planar outer portions 318DD, 318DH due to the etch loading effect when etching the trenches to form CDTI structure 314D. In one embodiment, the difference between the first depth T1 of central portion 316D and the second depth T2 of the plurality of planar outer portions 318DD, 318DH may be in a range between 5 nm to 200 nm.

As described above in FIG. 3D, it is appreciated that CDTI structure 304D of FIG. 3H includes additional planar outer portions, which are outside of the plane and therefore not visible in the cross-section view depicted in FIG. 3H. Planes that are formed by the plurality of planar outer portions 318 of CDTI structure 314D intersect in a line that is coincident or overlaps with the longitudinal center line 320D of the central portion 316D of the CDTI structure 314D as shown in FIG. 3H.

The example cross-section view illustrated in FIG. 3H also shows that pixel cell 304D includes a BDTI structure 336D that surrounds the pixel cell 304D region of the semiconductor layer 322D. As illustrated in the depicted example, the BDTI structure 336D extends a third depth T3 from the backside 328D towards the front side 326D of the semiconductor layer 322D to isolate or separate each of the pixel cells 304D from neighboring pixel cells in the pixel array. In depicted example, the third depth T3 is greater than the first depth T1 and substantially equal to the thickness of the semiconductor layer 322D such that BDTI structure 336D extends from the backside 328D to the front side 326D of the semiconductor layer 322D. FIG. 3H shows that in one example, the outer end of each of the plurality of planar outer portions 318D is spaced apart and separated from the BDTI structure 336D by an approximately equal second distance D2.

Figure 3I:
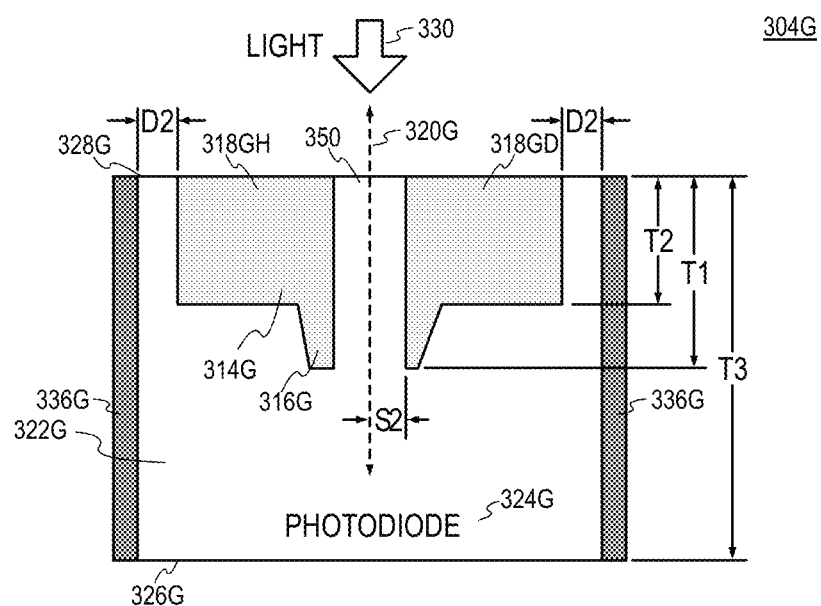
FIG. 3I is an example cross-section view through a central portion and a coplanar pair of outer portions of the example cell deep trench isolation structure of FIG. 3G in accordance with the teachings of the present invention.

FIG. 3I is an example cross-section view of pixel cell 304G through the central portion 316G and the coplanar pair of outer portions 318GD and 318GH of the example CDTI structure 314G of FIG. 3G in accordance with the teachings of the present invention. In other words, it is appreciated that the example pixel cell 304G of FIG. 3I may be another view of example pixel cell 304G of FIG. 3G, and that similarly named and numbered elements referenced below are coupled and function as described above. It is noted that the example cross-section view of pixel cell 304G shown in FIG. 3I may correspond to a cross-section view of pixel cell 304G of FIG. 3G along dashed line E-E'.

As shown in the example depicted in FIG. 3I, pixel cell 304G includes a photodiode 324G disposed in a pixel cell region of a semiconductor layer 322G and proximate to a front side 326G of the semiconductor layer 322G to generate image charge in response to incident light 330 that is directed through a backside 328G of the semiconductor layer 322G to the photodiode 324G. The CDTI structure 314G is disposed in the pixel cell 304G region of the semiconductor layer 322G along an optical path of the incident light 330 to the photodiode 324G and proximate to a backside 328G of the semiconductor layer 322G. As shown in the illustrated example, the CDTI structure 314G includes a central portion 316G, which extends a first depth T1 from the backside 328G towards the front side 326G of the semiconductor layer 322G. As shown in the example, an opening 350 is formed in the central portion 316G of CDTI structure 314G of pixel cell 304G of FIG. 3G. As shown in the example, the opening 350 is centered and aligned with the longitudinal center line 320G of the central portion 316G of the CDTI structure 314G. In the example, the opening 350 is substantially circular in shape and is filled with the semiconductor material of semiconductor layer 322G. In one example, the opening 350 has a radius of S2, which in various examples may be in a range of 5 to 250 nm. In other examples, it is appreciated that the radius S2 of opening 350 may have other values and that the opening 350 may have other shapes that are centered and aligned with the longitudinal center line 320G in central portion 316G of CDTI structure 314G.

The CDTI structure 314G also includes a plurality of planar outer portions, of which planar outer portions 318GD, 318GH are visible in FIG. 3I, and which extend laterally outward from the central portion 316G in the semiconductor layer 322G. As shown in the illustrated example, planar outer portions 318GD, 318GH extend a second depth T2 from the backside 328G towards the front side 326G of the semiconductor layer 322G. In the various examples, the width of the central portion 316G is greater than the thickness of the planar outer portions 318GD, 318GH and as such, the first depth T1 of central portion 316G is greater than the second depth T2 of the plurality of planar outer portions 318GD, 318GH due to the etch loading effect when etching the trenches to form CDTI structure 314G. In one embodiment, the difference between the first depth T1 of central portion 316G and the second depth T2 of the plurality of planar outer portions 318GD, 318GH may be in a range between 5 nm to 200 nm.

As described above in FIG. 3G, it is appreciated that CDTI structure 304G of FIG. 3I includes additional planar outer portions, which are outside of the plane and therefore not visible in the cross-section view depicted in FIG. 3I. Planes that are formed by the plurality of planar outer portions 318 of CDTI structure 314G intersect in a line that is coincident or overlaps with the longitudinal center line 320G of the central portion 316G of the CDTI structure 314G as shown in FIG. 3I. In the illustrated example of FIG. 3I, there is semiconductor material of the semiconductor layer 322G in between pairs of planar outer portions, for example, between planar outer portions 318GD, 318GH.

The example cross-section view illustrated in FIG. 3I also shows that pixel cell 304G includes a BDTI structure 336G that surrounds the pixel cell 304G region of the semiconductor layer 322G. As illustrated in the depicted example, the BDTI structure 336G extends a third depth T3 from the backside 328G towards the front side 326G of the semiconductor layer 322G to isolate or separate each of the pixel cells 304G from neighboring pixel cells in the pixel array. In depicted example, the third depth T3 is greater than the first depth T1 and substantially equal to the thickness of the semiconductor layer 322G such that BDTI structure 336G extends from the backside 328G to the front side 326G of the semiconductor layer 322G. FIG. 3I shows that in one example, the outer end of each of the plurality of planar outer portions 318G is spaced apart and separated from the BDTI structure 336G by an approximately equal second distance D2.

Figure 4A:
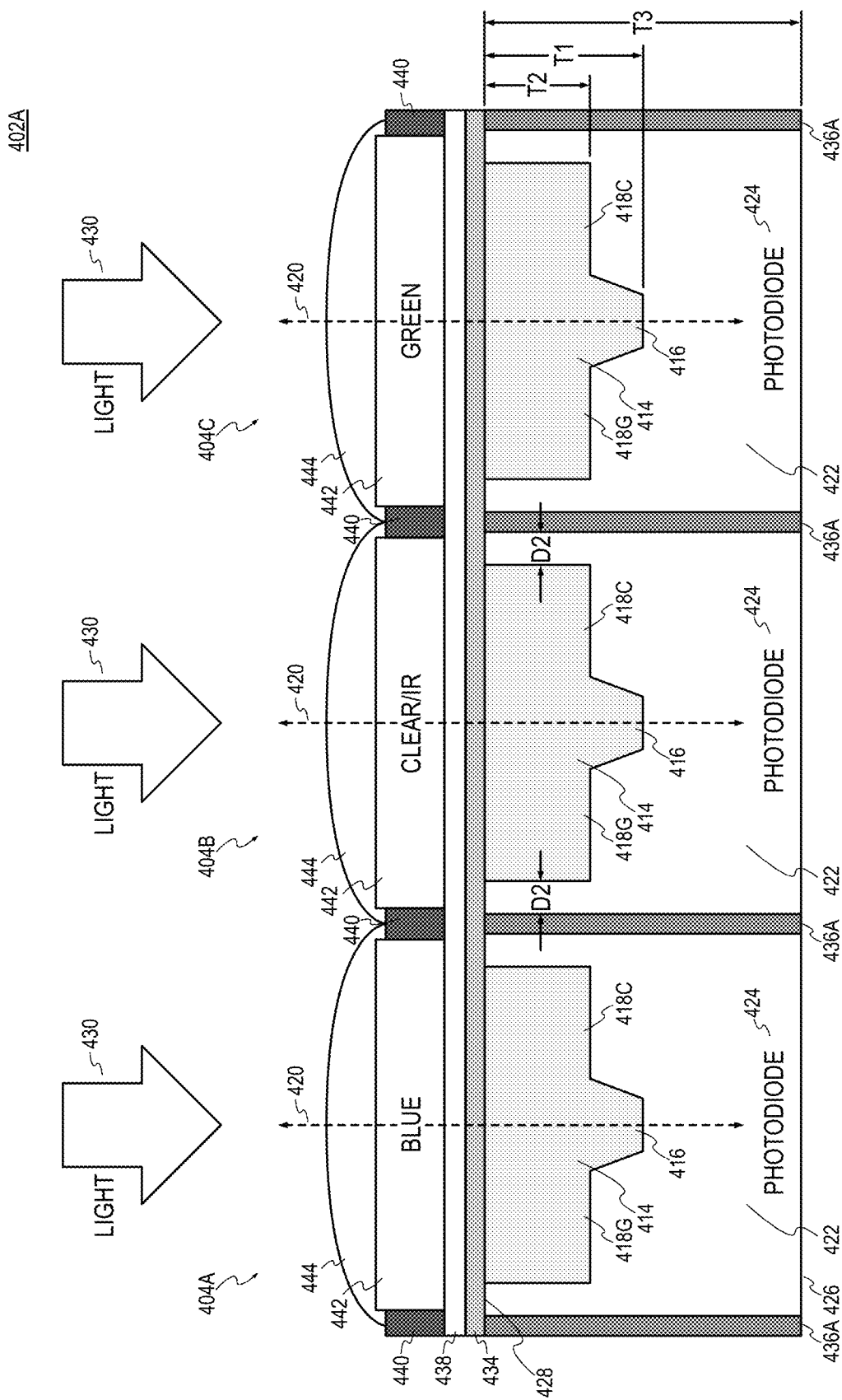
FIG. 4A is a cross-section view of through one example of an array of pixel cells with cell deep trench isolation structures in accordance with the teachings of the present invention.

FIG. 4A is a cross-section view of through one example of a color pixel array 402A including pixel cells 404 with CDTI structures in accordance with the teachings of the present invention. It is appreciated that the example pixel cells 404 of FIG. 4A may be examples of pixel cell 204 of FIGS. 2A-2D, and that similarly named and numbered elements referenced below are coupled and function as described above. In particular, it is noted that the example cross-section view of pixel cells 404 in FIG. 4A may correspond to pixel cell 204 shown in FIG. 2B and the cross-section view of pixel cell 204 of FIG. 2A along dashed line A-A'.

The example depicted in FIG. 4A, shows that example color pixel array 402A includes a plurality of pixel cells including pixel cell 404A, 404B, 404C. Each of the pixel cells 404A, 404B, 404C includes a photodiode 424 disposed in a respective pixel cell region of a semiconductor layer 422 and proximate to a front side 426 of the semiconductor layer 422 to generate image charge in response to incident light 430 that is directed through a backside 428 of the semiconductor layer 422 to the photodiode 424. The semiconductor layer 422 may be an epitaxial layer formed on a semiconductor substrate. The CDTI structure 414 of each pixel cell 404A, 404B, 404C is disposed in the pixel cell region of the semiconductor layer 422 along an optical path of the incident light 430 to the photodiode 424 and proximate to a backside 428 of the semiconductor layer 422. In the example illustrated in FIG. 4A, each CDTI structure 414 includes a central portion 416 that extends a first depth T1 from the backside 428 towards the front side 426 of the semiconductor layer 422. Each CDTI structure 414 also includes a plurality of planar outer portions, of which planar outer portions 418C, 418G are visible in FIG. 4A, and which extend laterally outward from the central portion 416 in the semiconductor layer 422. As shown in the illustrated example, planar outer portions 418C, 418G extend a second depth T2 from the backside 428 towards the front side 426 of the semiconductor layer 422. As mentioned above, in the various examples, the width of the central portion 416 is greater than the thickness of the planar outer portions 418C, 418G and as such, the first depth T1 of central portion 416 is greater than the second depth T2 of the plurality of planar outer portions 418C, 418G due to the etch loading effect when etching the trenches to form each CDTI structure 414.

Similar to the example described above in FIG. 2A, it is appreciated that CDTI structures 414 of FIG. 4A include additional planar outer portions, which are outside of the plane and therefore not visible in the cross-section view depicted in FIG. 4A. Planes that are formed by the plurality of planar outer portions 418 of CDTI structure 414 intersect in a line that is coincident or overlaps with the longitudinal center line 420 of the central portion 416 of each CDTI structure 414 as shown in FIG. 4A.

The example cross-section view illustrated in FIG. 4A also shows that pixel cells 404A, 404B, 404C of color pixel array 402A include a BDTI structure 436A that surrounds the respective pixel cell 404A, 404B, 404C regions of the semiconductor layer 422. As illustrated in the depicted example, the BDTI structure 436A extends a third depth T3 from the backside 428 to the front side 426 of the semiconductor layer 422 to isolate or separate each of the pixel cells 404A, 404B, 404C from neighboring pixel cells in the pixel array. As shown in the depicted example, the third depth T3 is greater than the first depth T1 and is substantially equal to the thickness between the backside 428 and the front side 426 of the semiconductor material layer 422. The BDTI structure 436A may be formed of a low k material, an oxide material, or other suitable dielectric material in the semiconductor layer 422. The BDTI structure 436A may be formed with the same or different material as the CDTI structure 414. FIG. 4A shows that in one example, the outer end of each of the plurality of planar outer portions 418 is spaced apart and separated from the BDTI structure 436A by an approximately equal second distance D2.

The example pixel array 402A shown in FIG. 4A also includes a buffer oxide layer 434 formed over the backside 428 of the semiconductor layer 422. An anti-reflection layer 438 is formed over the buffer oxide layer 434. In one example, the anti-reflection layer 438 may include one or more layers of dielectric material, such as silicon nitride, aluminum oxide, hafnium oxide, tantalum oxide, and/or other suitable materials. Optionally, a passivation layer may be disposed between buffer oxide layer 434 and the backside 428 of the semiconductor layer 422 for surface passivation to reduce dark current and white pixels. The passivation layer may be formed of a high k material, such as aluminum oxide, hafnium oxide, tantalum oxide. In addition, a color filter array layer including a plurality of color filters 442 is formed over the anti-reflection layer 438. In one example, the plurality of color filters 442 may have an arrangement based on a Bayer pattern. In the depicted example, a metal grid 440 is formed between each color filter 442 of the color filter array layer. A microlens layer including a plurality of microlenses 444 is formed over the color filter layer.

As shown in the depicted example, each microlens 444 and each color filter 442 is formed over and aligned with a respective CDTI structure 414 and photodiode 424 of the respective pixel cell 404A, 404B, 404C. As such, the optical path along which incident light 430 is directed passes through a respective microlens 444, color filter 442, anti-reflection layer 438, buffer oxide layer 434, backside 428, along CDTI structure 414, and through semiconductor layer 422 to photodiode 424 as shown.

In the example depicted in FIG. 4A, pixel cell 404A includes a blue color filter 442, pixel cell 404B includes a clear/IR filter 442, and pixel cell 404C includes a green color filter 442. Blue color filter 442 is adapted to allow substantially blue incident light 430 to pass, clear/IR filter 442 is adapted to allow a spectrum of light having a range including visible light through IR light, which includes NIR light, to pass, and green color filter 442 is adapted to allow substantially green incident light 430 to pass. As such, in the depicted example, pixel cell 404A is adapted to detect blue light, pixel cell 404B is adapted to detect NIR light, and pixel cell 404C is adapted to detect green light.

Figure 4B:
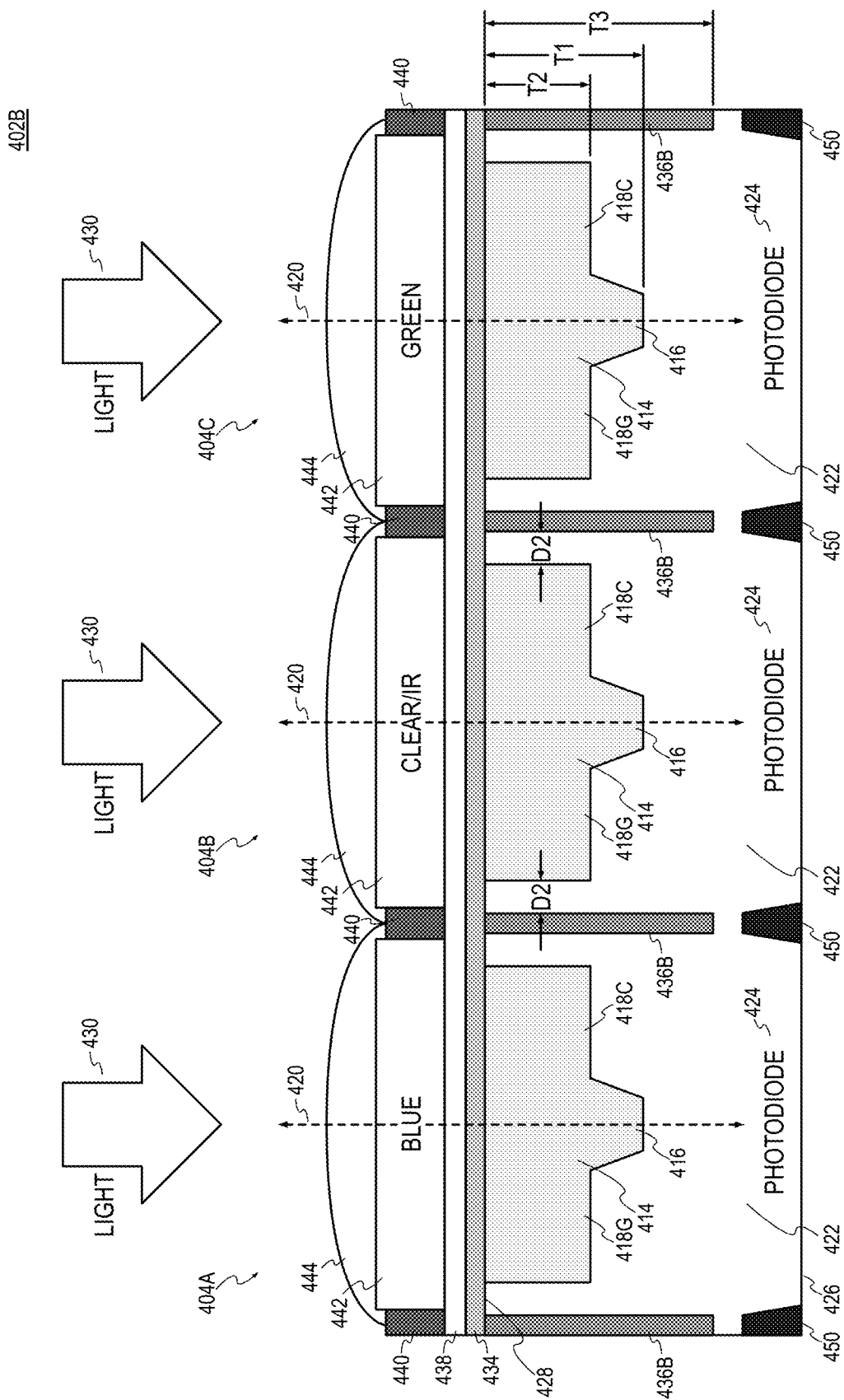
FIG. 4B is a cross-section view of through another example of an array of pixel cells with cell deep trench isolation structures in accordance with the teachings of the present invention.

FIG. 4B is a cross-section view of through another example a color pixel array 402B including pixel cells with CDTI structures in accordance with the teachings of the present invention. It is appreciated that the example pixel cells 404 of FIG. 4B may also be examples of pixel cell 204 of FIGS. 2A-2D, and that similarly named and numbered elements referenced below are coupled and function as described above. In particular, it is noted that the example cross-section view of pixel cells 404 in FIG. 4B may correspond to pixel cell 204 shown in FIG. 2B and the cross-section view of pixel cell 204 of FIG. 2A along dashed line A-A'. It is appreciated that color pixel array 402B of FIG. 4B shares many similarities with color pixel array 402A of FIG. 4A.

For instance, the example color pixel array 402B depicted in FIG. 4B includes a plurality of pixel cells including pixel cells 404A, 404B, 404C. Each of the pixel cells 404A, 404B, 404C includes a photodiode 424 disposed in a respective pixel cell region of a semiconductor layer 422 and proximate to a front side 426 of the semiconductor layer 422 to generate image charge in response to incident light 430 that is directed through a backside 428 of the semiconductor layer 422 to the photodiode 424. The semiconductor layer 422 may be an epitaxial layer formed on a semiconductor substrate. The CDTI structure 414 of each pixel cell 404A, 404B, 404C is disposed in the pixel cell region of the semiconductor layer 422 along an optical path of the incident light 430 to the photodiode 424 and proximate to a backside 428 of the semiconductor layer 422. In the example illustrated in FIG. 4B, each CDTI structure 414 includes a central portion 416 that extends a first depth T1 from the backside 428 towards the front side 426 of the semiconductor layer 422. Each CDTI structure 414 also includes a plurality of planar outer portions, of which planar outer portions 418C, 418G are visible in FIG. 4B, and which extend laterally outward from the central portion 416 in the semiconductor layer 422. As shown in the illustrated example, planar outer portions 418C, 418G extend a second depth T2 from the backside 428 towards the front side 426 of the semiconductor layer 422. As mentioned above, in the various examples, the width of the central portion 416 is greater than the thickness of the planar outer portions 418C, 418G and as such, the first depth T1 of central portion 416 is greater than the second depth T2 of the plurality of planar outer portions 418C, 418G due to the etch loading effect when etching the trenches to form each CDTI structure 414.

Similar to the example described above in FIG. 2A, it is appreciated that CDTI structures 414 of FIG. 4B include additional planar outer portions, which are outside of the plane and therefore not visible in the cross-section view depicted in FIG. 4B. Planes that are formed by the plurality of planar outer portions of CDTI structure 414 intersect in a line that is coincident or overlaps with the longitudinal center line 420 of the central portion 416 of each CDTI structure 414 as shown in FIG. 4B.

The example cross-section view illustrated in FIG. 4B also shows that pixel cells 404A, 404B, 404C of color pixel array 402B include a BDTI structure 436B that surrounds the respective pixel cell 404A, 404B, 404C regions of the semiconductor layer 422. As shown in the depicted example, the BDTI structure 436B extends a third depth T3 from the backside 428 towards the front side 426 of the semiconductor layer 422 to isolate or separate each of the pixel cells 404A, 404B, 404C from neighboring pixel cells in the pixel array. One difference between color pixel array 402B of FIG. 4B and color pixel array 402A of FIG. 4A is that as illustrated in FIG. 4B, the BDTI structure 436B is a partial BDTI structure as the third depth T3 is greater than the first depth T1 and is less than the thickness between the backside 428 and the front side 426 of the semiconductor layer 422. In one example, the third depth T3 may be in a range of approximately 1.5 to 2 μm. In other examples, it is appreciated that the third depth T3 may be in a different range of values that is greater than the first depth T1 and less than the thickness of semiconductor layer 422. In one example, an optional shallow trench structure 450 may also be included in color pixel array 402B. As shown in the example depicted in FIG. 4B, shallow trench structure 450 is disposed in semiconductor layer 422 proximate to the front side 426 between each pixel cell 404 and aligned with partial BDTI structure 436B as shown to surround each pixel cell 404.

The BDTI structure 436B and optional shallow trench structure 450 may be formed of a low k material, an oxide material, or other suitable dielectric material in the semiconductor layer 422. The BDTI structure 436B and/or the shallow trench structure 450 may be formed with the same or different material as the CDTI structure 414. FIG. 4B shows that in one example, the outer end of each of the plurality of planar outer portions 418 is spaced apart and separated from the BDTI structure 436B by an approximately equal second distance D2.

The example pixel array 402B shown in FIG. 4B also includes a buffer oxide layer 434 formed over the backside 428 of the semiconductor layer 422. An anti-reflection layer 438 is formed over the buffer oxide layer 434. In one example, the anti-reflection layer 438 may include one or more layers of dielectric material, such as silicon nitride, aluminum oxide, hafnium oxide, tantalum oxide, and/or other suitable materials. Optionally, a passivation layer may be disposed between buffer oxide layer 434 and the backside 428 of the semiconductor layer 422 for surface passivation to reduce dark current and white pixels. The passivation layer may be formed of a high k material, such as aluminum oxide, hafnium oxide, tantalum oxide In addition, a color filter array layer including a plurality of color filters 442 is formed over the anti-reflection layer 438. In one example, the plurality of color filters 442 may have an arrangement based on a Bayer pattern. In the depicted example, a metal grid 440 is formed between each color filter 442 of the color filter array layer. A microlens layer including a plurality of microlenses 444 is formed over the color filter layer.

As shown in the depicted example, each microlens 444 and each color filter 442 is formed over and aligned with a respective CDTI structure 414 and photodiode 424 of the respective pixel cell 404A, 404B, 404C. As such, the optical path along which incident light 430 is directed passes through a respective microlens 444, color filter 442, anti-reflection layer 438, buffer oxide layer 434, backside 428, along CDTI structure 414, and through semiconductor layer 422 to photodiode 424 as shown.

In the example depicted in FIG. 4B, pixel cell 404A includes a blue color filter 442, pixel cell 404B includes a clear/IR filter 442, and pixel cell 404C includes a green color filter 442. Blue color filter 442 is adapted to allow substantially blue incident light 430 to pass, clear/IR filter 442 is adapted to allow a spectrum of light having a range including visible light through IR light, which includes NIR light, to pass, and green color filter 442 is adapted to allow substantially green incident light 430 to pass. As such, in the depicted example, pixel cell 404A is adapted to detect blue light, pixel cell 404B is adapted to detect NIR light, and pixel cell 404C is adapted to detect green light.

FIGS. 5A-5F illustrate top views of color pixel arrays 502 with various arrangements of pixel cells including example CDTI structures 514 accordance with the teachings of the present invention. It is appreciated that the example color pixel arrays 502 of FIGS. 5A-5E include various examples and arrangements of pixel cells 504 similar to the cross-section views shown in FIGS. 4A-4B, and that similarly named and numbered elements referenced below are coupled and function as described above. Furthermore, it is noted that the example top views of the CDTI structures 514 in FIGS. 5A-5E may be examples of the CDTI structure 214 described above in FIGS. 2A-2D.

Figure 5A:
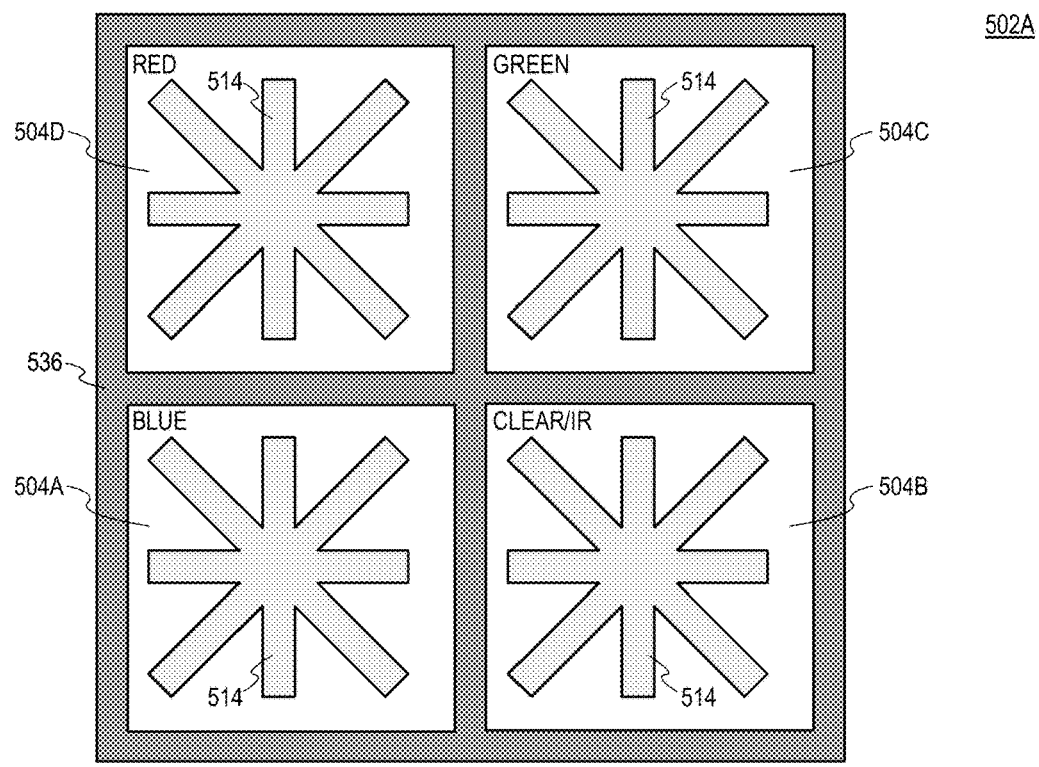
FIGS. 5A-5F illustrate top views of color pixel arrays including various arrangements of pixel cells including example cell deep trench structures accordance with the teachings of the present invention.

Referring to the example depicted in FIG. 5A, a color pixel array 502A is illustrated including a plurality of pixel cells 504A, 504B, 504C, 504D. In the example, pixel cell 504A includes a blue color filter and is therefore adapted to detect blue light, pixel cell 504B includes a clear/IR color filter and is therefore adapted to detect NIR light, pixel cell 504C includes a green color filter and is therefore adapted to detect green light, and pixel cell 504D includes a red color filter and is therefore adapted to detect red light. As shown in the depicted example, pixel cells 504A, 504B, 504C, 504D each include a CDTI structure 514 having a shape substantially similar to the shape of the example CDTI structure 214 described above in FIGS. 2A-2D. In other examples, pixel cells 504A, 504B, 504C, 504D may each include a CDTI structure 514 having a shape substantially similar to the shape of the example CDTI structures described above in FIGS. 3A-3G. Thus, it is appreciated that the example depicted in FIG. 5A illustrates an example in which pixel cell 504B is adapted to detect NIR light and that one or more of the neighboring pixel cells (e.g., 504A, 504C, 504D) that are configured to detect colors of light other than NIR light also include respective CDTI structures 514. Color pixel array 502A further includes a BDTI structure 536 that surrounds the individual pixel cell 504A, 504B, 504C, 504D. In the example, the BDTI structure 536 is interconnected forming a grid-like structure that isolates or separates the pixel cells 504 from neighboring pixel cells in the color pixel array 502A. The BDTI structure 536 may extend from the backside to the front side of the semiconductor layer forming a full backside deep trench isolation structure. The BDTI structure 536 may also extend into the semiconductor layer toward the front side of the semiconductor layer with a depth greater than enclosed CDTI structure 514 and less than the thickness of the semiconductor layer to form a partial backside deep trench isolation structure. The BDTI structure 536 may be formed of a low k material, an oxide material, or other suitable dielectric material in the semiconductor layer. The BDTI structure 536 may be formed with the same or different material as the CDTI structure 514

Figure 5B:
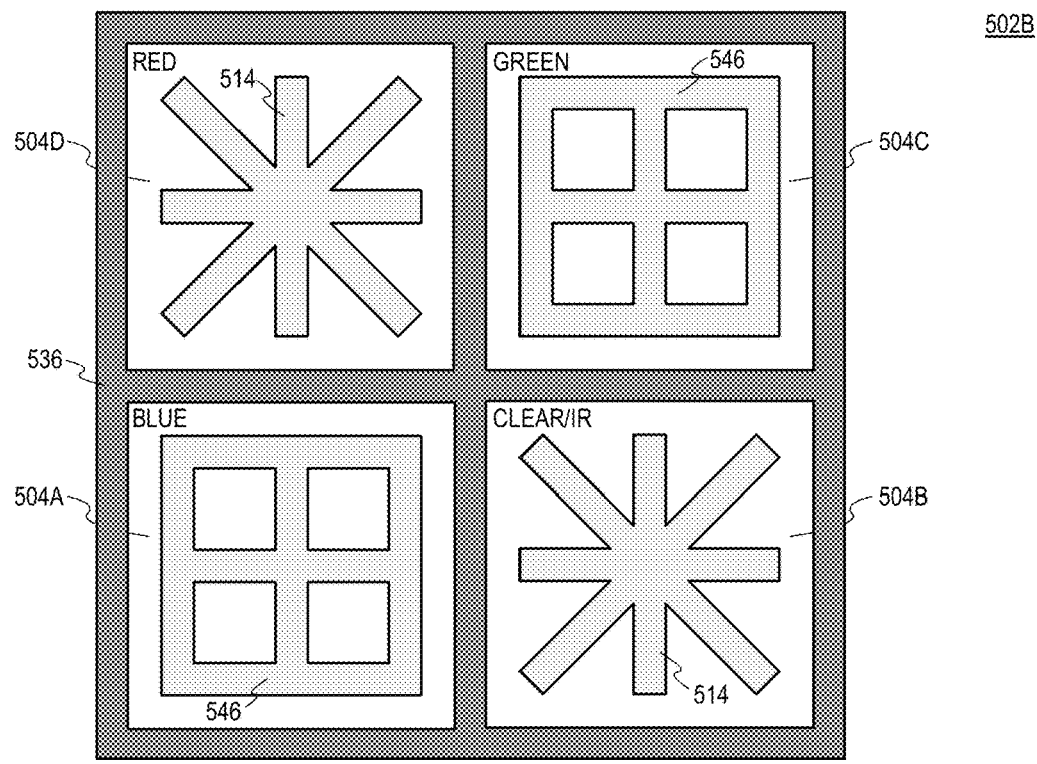

Referring now to the example depicted in FIG. 5B, a color pixel array 502B is illustrated including a plurality of pixel cells 504A, 504B, 504C, 504D. In the example, pixel cell 504A includes a blue color filter and is therefore adapted to detect blue light, pixel cell 504B includes a clear/IR color filter and is therefore adapted to detect NIR light, pixel cell 504C includes a green color filter and is therefore adapted to detect green light, and pixel cell 504D includes a red color filter and is therefore adapted to detect red light. As shown in the depicted example, pixel cells 504B, 504D each include a CDTI structure 514 having a shape substantially similar to the shape of the example CDTI structure 214 described above in FIGS. 2A-2D. In other examples, pixel cells 504A, 504B, 504C, 504D of color pixel array 502B may each include a CDTI structure 514 having a shape substantially similar to the shape of the example CDTI structures described above in FIGS. 3A-3G. Pixel cells 504A, 504C include a CDTI structure 546 having a different shape and therefore a different structure than the example CDTI structure 214 described above in FIGS. 2A-2D. For instance, in the example depicted in FIG. 5B, CDTI structure 546 has a top view shape of a "+" with a "box" surrounding the "+" shape. Thus, it is appreciated that the example depicted in FIG. 5B illustrates an example in which pixel cell 504B is adapted to detect NIR light and that one or more of the neighboring pixel cells (e.g., 504A, 504C) that are configured to detect colors of light other than NIR light include respective CDTI structures 546 having a different shape for achieving optimal light detection performance.

Figure 5C:
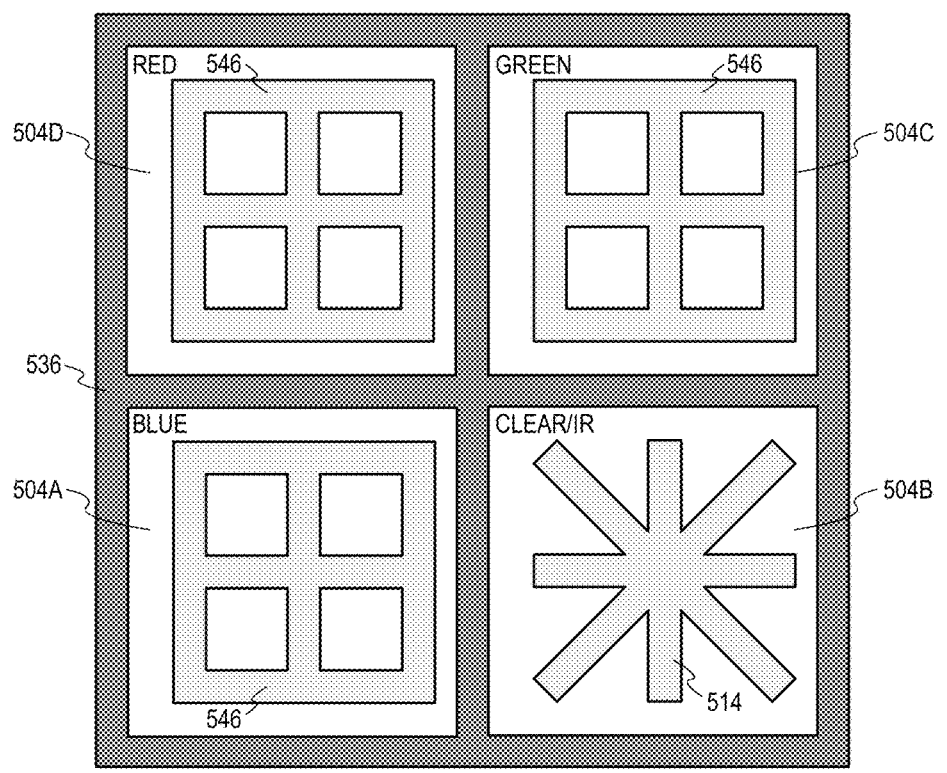

Referring now to the example depicted in FIG. 5C, a color pixel array 502C is illustrated including a plurality of pixel cells 504A, 504B, 504C, 504D. In the example, pixel cell 504A includes a blue color filter and is therefore adapted to detect blue light, pixel cell 504B includes a clear/IR color filter and is therefore adapted to detect NIR light, pixel cell 504C includes a green color filter and is therefore adapted to detect green light, and pixel cell 504D includes a red color filter and is therefore adapted to detect red light. As shown in the depicted example, pixel cell 504B includes a CDTI structure 514 having a shape substantially similar to the shape of the example CDTI structure 214 described above in FIGS. 2A-2D. In other examples, pixel cell 504B includes a CDTI structure 514 having a shape substantially similar to the shape of the example CDTI structures described above in FIGS. 3A-3G. Pixel cells 504A, 504C, 504D include the CDTI structure 546 described in FIG. 5B having a different shape and therefore a different structure than the example CDTI structure 214 described above in FIGS. 2A-2D. Thus, it is appreciated that the example depicted in FIG. 5C also illustrates an example in which pixel cell 504B is adapted to detect NIR light and that one or more of the neighboring pixel cells (e.g., 504A, 504C, 504D) that are configured to detect colors of light other than NIR light include respective CDTI structures 546 having a different shape.

Figure 5D:
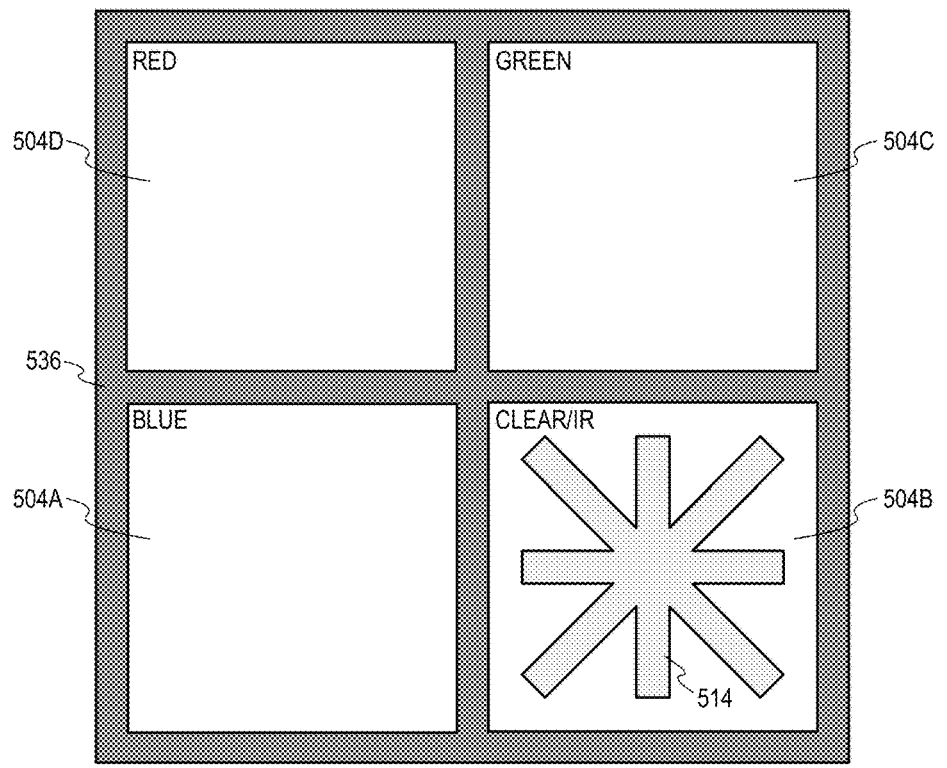

Referring now to the example depicted in FIG. 5D, a color pixel array 502D is illustrated including a plurality of pixel cells 504A, 504B, 504C, 504D. In the example, pixel cell 504A includes a blue color filter and is therefore adapted to detect blue light, pixel cell 504B includes a clear/IR color filter and is therefore adapted to detect NIR light, pixel cell 504C includes a green color filter and is therefore adapted to detect green light, and pixel cell 504D includes a red color filter and is therefore adapted to detect red light. As shown in the depicted example, pixel cell 504B includes a CDTI structure 514 having a shape substantially similar to the shape of the example CDTI structure 214 described above in FIGS. 2A-2D. In other examples, pixel cell 504B includes a CDTI structure 514 having a shape substantially similar to the shape of the example CDTI structures described above in FIGS. 3A-3G. In the depicted example, pixel cells 504A, 504C, 504D do not include a CDTI structure. In other words, in the example pixel cells 504A, 504C, 504D shown in FIG. 5D, the incident light is directed through the backside of the semiconductor layer to the photodiode without a CDTI structure along the optical path through the semiconductor layer. Thus, it is appreciated that the example depicted in FIG. 5D illustrates an example in which pixel cell 504B is adapted to detect NIR light and that the neighboring pixel cells (e.g., 504A, 504C, 504D) that are configured to detect colors of light other than NIR light do not include respective CDTI structures 514.

Figure 5E:
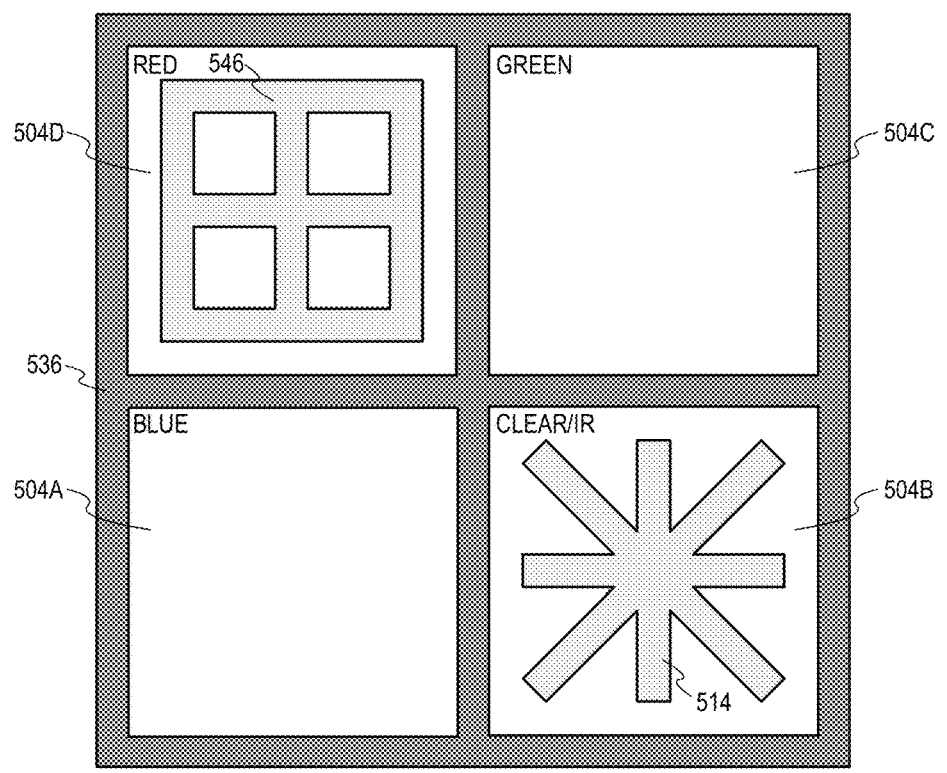

Referring now to the example depicted in FIG. 5E, a color pixel array 502E is illustrated including a plurality of pixel cells 504A, 504B, 504C, 504D. In the example, pixel cell 504A includes a blue color filter and is therefore adapted to detect blue light, pixel cell 504B includes a clear/IR color filter and is therefore adapted to detect NIR light, pixel cell 504C includes a green color filter and is therefore adapted to detect green light, and pixel cell 504D includes a red color filter and is therefore adapted to detect red light. As shown in the depicted example, pixel cell 504B includes a CDTI structure 514 having a shape substantially similar to the shape of the example CDTI structure 214 described above in FIGS. 2A-2D. Pixel cell 504D includes the CDTI structure 546 described in FIG. 5B having a different shape and therefore a different structure than the example CDTI structure 214 described above in FIGS. 2A-2D. In other examples, pixel cell 504B may include a CDTI structure 514 having a shape substantially similar to the shape of the example CDTI structures described above in FIGS. 3A-3G. In the depicted example, pixel cells 504A, 504C do not include a CDTI structure. Thus, it is appreciated that the example depicted in FIG. 5E illustrates an example in which pixel cell 504B is adapted to detect NIR light and that one or more of the neighboring pixel cells (e.g., 504D) that are configured to detect colors of light other than NIR light include a respective CDTI structure 546 having a different shape as well as one or more neighboring pixel cells (e.g., 504A, 504C) that are configured to detect colors of light other than NIR light do not include respective CDTI structures 514. In other examples, CDTI structure may be formed in the pixel cells that are configured to detect light intensity having longer wavelengths such as for example for light wavelengths greater than 700 nm (e.g., red, NIR, and IR).

Figure 5F:
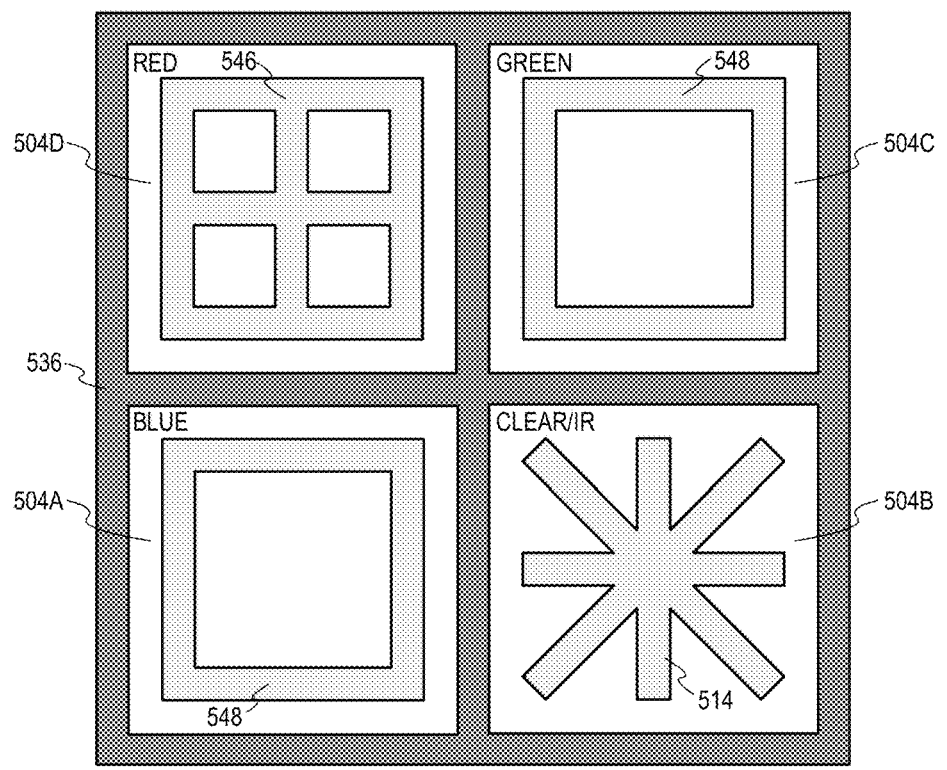

Referring now to the example depicted in FIG. 5F, a color pixel array 502F is illustrated including a plurality of pixel cells 504A, 504B, 504C, 504D. In the example, pixel cell 504A includes a blue color filter and is therefore adapted to detect blue light, pixel cell 504B includes a clear/IR color filter and is therefore adapted to detect NIR light, pixel cell 504C includes a green color filter and is therefore adapted to detect green light, and pixel cell 504D includes a red color filter and is therefore adapted to detect red light. As shown in the depicted example, pixel cell 504B includes a CDTI structure 514 having a shape substantially similar to the shape of the example CDTI structure 214 described above in FIGS. 2A-2D. In other examples, pixel cell 504B may include a CDTI structure 514 having a shape substantially similar to the shape of the example CDTI structures described above in FIGS. 3A-3G. Pixel cell 504D includes the CDTI structure 546 described in FIG. 5B having a different shape and therefore a different structure than the example CDTI structure 214 described above in FIGS. 2A-2D or the example CDTI structures described above in FIGS. 3A-3G. Further, pixel cells 504A, 504C include a CDTI structure 548 having yet another different shape and/or structure than the example CDTI structure 214 described above in FIGS. 2A-2D or example CDTI structures described above in FIGS. 3A-3G. For instance, in the example depicted in FIG. 5F, CDTI structure 548 has a top view shape of "box." Thus, it is appreciated that the example depicted in FIG. 5F also illustrates another example in which pixel cell 504B is adapted to detect NIR light and that one or more of the neighboring pixel cells (e.g., 504A, 504C, 504D) that are configured to detect colors of light other than NIR light include respective CDTI structures 546, 548 having a different shape.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, comprising:
 a photodiode disposed in a pixel cell region of a semiconductor layer and proximate to a front side of the semiconductor layer to generate image charge in response to incident light directed through a backside of the semiconductor layer to the photodiode; and
 a cell deep trench isolation (CDTI) structure disposed in the pixel cell region of the semiconductor layer along an optical path of the incident light to the photodiode and proximate to the backside of the semiconductor layer, wherein the CDTI structure comprises:
  a central portion extending a first depth from the backside towards the front side of the semiconductor layer; and
  a plurality of planar outer portions extending laterally outward from the central portion in the semiconductor layer, wherein the plurality of planar output portions further extend a second depth from the backside towards the front side of the semiconductor layer, wherein the first depth is greater than the second depth,
  wherein planes formed by the plurality of planar outer portions intersect in a line coincident with a longitudinal center line of the central portion of the CDTI structure.

2. The pixel cell of claim 1, wherein the plurality of planar outer portions includes at least eight planar outer portions extending laterally outward from the central portion of the CDTI structure in the semiconductor layer.

3. The pixel cell of claim 1, wherein the plurality of planar outer portions includes pairs of planar outer portions that are coplanar.

4. The pixel cell of claim 1, wherein a width of the central portion is greater than a thickness of each of the plurality of planar outer portions of the CDTI structure.

5. The pixel cell of claim 1, wherein a first distance between each of the plurality of planar outer portions increases as a distance from the central portion of the CDTI structure increases.

6. The pixel cell of claim 1, wherein an inner end of each of a first subset of the plurality of planar outer portions is laterally offset from the central portion by a lateral offset distance, wherein each of a second subset of the plurality of planar outer portions is in contact with the central portion, wherein the second subset of the plurality of planar portions includes planar outer portions of the plurality of planar outer portions not included in the first subset of the plurality of planar portions.

7. The pixel cell of claim 1, wherein the CDTI structure further comprises a perimeter portion surrounding the plurality of planar outer portions and the central portion of the CDTI structure in the semiconductor layer, wherein the perimeter portion is in contact with outer ends of the plurality of planar outer portions in the semiconductor layer.

8. The pixel cell of claim 1, further comprising a backside deep trench isolation (BDTI) structure surrounding the pixel cell region of the semiconductor layer to isolate the pixel cell from neighboring pixel cells, wherein the BDTI structure extends a third depth from the backside toward the front side of the semiconductor layer.

9. The pixel cell of claim 8, wherein the third depth is greater than the first depth and substantially equal to a thickness of the semiconductor layer between the backside and the front side of the semiconductor layer.

10. The pixel cell of claim 8, wherein the third depth is greater than the first depth and less than a thickness of the semiconductor layer between the backside and the front side of the semiconductor layer.

11. The pixel cell of claim 10, further comprising a shallow trench structure disposed in the semiconductor layer proximate to the front side of the semiconductor layer and aligned with the BDTI structure to surround the pixel cell.

12. The pixel cell of claim 8, wherein an outer end of each of the plurality of planar outer portions is spaced apart and separated from the BDTI structure by a second distance.

13. The pixel cell of claim 8, wherein each of the plurality of planar outer portions extends from the central portion of the CDTI structure to the BDTI structure.

14. The pixel cell of claim 1, wherein the CDTI structure comprises dielectric material in the semiconductor layer.

15. The pixel cell of claim 1, wherein the central portion comprises an opening formed in the central portion, wherein the opening is centered and aligned with the longitudinal center line of the central portion.

16. The pixel cell of claim 15, wherein the opening is substantially circular in shape and is filled with semiconductor material of the semiconductor layer.

17. The pixel cell of claim 1, wherein the pixel cell is adapted to detect near infrared (NIR) light.

18. The pixel cell of claim 17, wherein neighboring pixel cells are configured to detect colors of light other than NIR light.

19. The pixel cell of claim 18, wherein the neighboring pixel cells that are configured to detect colors of light other than NIR light do not include respective CDTI structures.

20. The pixel cell of claim 18, wherein one or more of the neighboring pixel cells that are configured to detect colors of light other than NIR light include respective CDTI structures.

21. The pixel cell of claim 18, wherein one or more of the neighboring pixel cells that are configured to detect colors of light other than NIR light include respective CDTI structures having a different shape.

22. The pixel cell of claim 1, further comprising:
a buffer oxide layer formed over the backside of the semiconductor layer;
an anti-reflection layer formed over the buffer oxide layer;
a color filter layer formed over the anti-reflection layer; and
a microlens layer formed over the color filter layer.

23. An imaging system, comprising:
a pixel array including an array of pixel cells formed in a semiconductor layer, wherein the array of pixel cells includes near infrared (NIR) pixel cells adapted to detect at least NIR light, wherein each of the NIR pixel cells comprises:
  a photodiode disposed in a pixel cell region of the semiconductor layer and proximate to a front side of the semiconductor layer to generate image charge in response to incident light directed through a backside of the semiconductor layer to the photodiode; and
  a cell deep trench isolation (CDTI) structure disposed in the pixel cell region of the semiconductor layer along an optical path of the incident light to the photodiode and proximate to the backside of the semiconductor layer, wherein the CDTI structure comprises:
    a central portion extending a first depth from the backside towards the front side of the semiconductor layer; and
    a plurality of planar outer portions extending laterally outward from the central portion in the semiconductor layer, wherein the plurality of planar output portions further extend a second depth from the backside towards the front side of the semiconductor layer, wherein the first depth is greater than the second depth,
    wherein planes formed by the plurality of planar outer portions intersect in a line coincident with a longitudinal center line of the central portion of the CDTI structure;
control circuitry coupled to the pixel array to control operation of the pixel array; and
readout circuitry coupled to the pixel array to readout image data from the pixel array.

24. The imaging system of claim 23, further comprising function logic coupled to the readout circuitry to store the image data readout from the pixel array.

25. The imaging system of claim 23, wherein the plurality of planar outer portions includes at least eight planar outer portions extending laterally outward from the central portion of the CDTI structure in the semiconductor layer.

26. The imaging system of claim 23, wherein the plurality of planar outer portions includes pairs of planar outer portions that are coplanar.

27. The imaging system of claim 23, wherein a width of the central portion is greater than a thickness of each of the plurality of planar outer portions of the CDTI structure.

28. The imaging system of claim 23, wherein a first distance between each of the plurality of planar outer portions increases as a distance from the central portion of the CDTI structure increases.

29. The imaging system of claim 23, wherein an inner end of each of a first subset of the plurality of planar outer portions is laterally offset from the central portion by a lateral offset distance, wherein each of a second subset of the plurality of planar outer portions is in contact with the central portion, wherein the second subset of the plurality of planar portions includes planar outer portions of the plurality of planar outer portions not included in the first subset of the plurality of planar portions.

30. The imaging system of claim 23, wherein the CDTI structure further comprises a perimeter portion surrounding the plurality of planar outer portions and the central portion of the CDTI structure in the semiconductor layer, wherein the perimeter portion is in contact with outer ends of the plurality of planar outer portions in the semiconductor layer.

31. The imaging system of claim 23, wherein each of the NIR pixel cells further comprises a backside deep trench isolation (BDTI) structure surrounding the pixel cell region of the semiconductor layer to isolate the NIR pixel cell from neighboring pixel cells in the array of pixel cells, wherein the BDTI structure extends a third depth from the backside toward the front side of the semiconductor layer.

32. The imaging system of claim 31, wherein the third depth is greater than the first depth and substantially equal to a thickness of the semiconductor layer between the backside and the front side of the semiconductor layer.

33. The imaging system of claim 31, wherein the third depth is greater than the first depth and less than a thickness of the semiconductor layer between the backside and the front side of the semiconductor layer.

34. The imaging system of claim 33, wherein each of the NIR pixel cells further comprises a shallow trench structure disposed in the semiconductor layer proximate to the front side of the semiconductor layer and aligned with the BDTI structure to surround the pixel cells.

35. The imaging system of claim 34, wherein an outer end of each of the plurality of planar outer portions is spaced apart and separated from the BDTI structure by a second distance.

36. The imaging system of claim 34, wherein each of the plurality of planar outer portions extends from the central portion of the CDTI structure to the BDTI structure.

37. The imaging system of claim 23, wherein the CDTI structure comprises dielectric material in the semiconductor layer.

38. The imaging system of claim 23, wherein the central portion comprises an opening formed in the central portion, wherein the opening is centered and aligned with the longitudinal center line of the central portion.

39. The imaging system of claim 38, wherein the opening is substantially circular in shape and is filled with semiconductor material of the semiconductor layer.

40. The imaging system of claim 23, wherein neighboring pixel cells of each of the NIR pixel cells in the array of pixel cells are adapted to detect colors of light other than NIR light.

41. The imaging system of claim 40, wherein the neighboring pixel cells that are adapted to detect colors of light other than NIR light do not include respective CDTI structures.

42. The imaging system of claim 40, wherein one or more of the neighboring pixel cells that are configured to detect colors of light other than NIR light include respective CDTI structures.

43. The imaging system of claim 40, wherein one or more of the neighboring pixel cells that are configured to detect colors of light other than NIR light include respective CDTI structures having a different shape.

44. The imaging system of claim 23, wherein each of the NIR pixel cells further comprises:

a buffer oxide layer formed over the backside of the semiconductor layer;
an anti-reflection layer formed over the buffer oxide layer;
a color filter layer formed over the anti-reflection layer; and
a microlens layer formed over the color filter layer.

* * * * *

UNITED STATES PATENT AND TRADEMARK OFFICE
CERTIFICATE OF CORRECTION

PATENT NO. : 11,335,718 B2
APPLICATION NO. : 16/931229
DATED : May 17, 2022
INVENTOR(S) : Hui Zang et al.

It is certified that error appears in the above-identified patent and that said Letters Patent is hereby corrected as shown below:

In the Specification

In Column 23, Line 56, delete "oxide" and insert -- oxide. --, therefor.

In Column 25, Line 3, delete "514" and insert -- 514. --, therefor.

In Column 26, Line 6, delete "in in" and insert -- in --, therefor.

In Column 29, Line 35, delete "output" and insert -- outer --, therefor.

Signed and Sealed this
Thirteenth Day of December, 2022

Katherine Kelly Vidal
*Director of the United States Patent and Trademark Office*